US010833078B2

(12) United States Patent
Smith et al.

(10) Patent No.: US 10,833,078 B2
(45) Date of Patent: Nov. 10, 2020

(54) SEMICONDUCTOR APPARATUS HAVING STACKED GATES AND METHOD OF MANUFACTURE THEREOF

(71) Applicant: Tokyo Electron Limited, Tokyo (JP)

(72) Inventors: Jeffrey Smith, Clifton Park, NY (US); Anton J. deVilliers, Clifton Park, NY (US); Kandabara N. Tapily, Mechanicville, NY (US); Subhadeep Kal, Albany, NY (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/206,513

(22) Filed: Nov. 30, 2018

(65) Prior Publication Data

US 2019/0172828 A1 Jun. 6, 2019

Related U.S. Application Data

(60) Provisional application No. 62/594,354, filed on Dec. 4, 2017.

(51) Int. Cl.
*H01L 27/092* (2006.01)
*H01L 27/06* (2006.01)
(Continued)

(52) U.S. Cl.
CPC ...... *H01L 27/092* (2013.01); *H01L 21/02603* (2013.01); *H01L 21/28088* (2013.01);
(Continued)

(58) Field of Classification Search
CPC ............... H01L 27/092; H01L 27/0688; H01L 29/0673; H01L 29/42392; H01L 29/4908;
(Continued)

(56) References Cited

U.S. PATENT DOCUMENTS 8,492,220 B2  7/2013  Erickson et al.
8,513,725 B2  8/2013  Sakuma et al.
(Continued)

FOREIGN PATENT DOCUMENTS

JP  5651415 B2  1/2015

OTHER PUBLICATIONS

International Search Report and Written Opinion of the International Searching Authority dated Mar. 22, 2019 in PCT/US2018/063618 filed Dec. 3, 2018, 9 pages.

*Primary Examiner* — Dung A. Le
(74) *Attorney, Agent, or Firm* — Oblon, McClelland, Maier & Neustadt, L.L.P.

(57) ABSTRACT

Aspects of the disclosure provide a semiconductor apparatus that comprises a first field-effect transistor (FET) formed on a substrate and comprising a first gate, a second FET stacked on the first FET along a direction substantially perpendicular to the substrate and comprising a second gate. The semiconductor apparatus also comprises a first routing track and a second routing track electrically isolated from the first routing track. Each of the first and second routing tracks is provided on a routing plane stacked on the second FET along said direction. The semiconductor apparatus also comprises a first conductive trace configured to conductively couple the first gate of the first FET to the first routing track, and a second conductive trace configured to conductively couple the second gate of the second FET to the second routing track.

20 Claims, 22 Drawing Sheets

(51) Int. Cl.
*H01L 29/06* (2006.01)
*H01L 29/423* (2006.01)
*H01L 29/49* (2006.01)
*H01L 21/8238* (2006.01)
*H01L 21/822* (2006.01)
*H01L 21/02* (2006.01)
*H01L 21/28* (2006.01)
*H01L 29/786* (2006.01)
*H01L 27/12* (2006.01)

(52) U.S. Cl.
CPC .. *H01L 21/8221* (2013.01); *H01L 21/823807* (2013.01); *H01L 21/823842* (2013.01); *H01L 27/0688* (2013.01); *H01L 27/124* (2013.01); *H01L 29/0673* (2013.01); *H01L 29/42392* (2013.01); *H01L 29/4908* (2013.01); *H01L 29/78696* (2013.01); *H01L 21/823871* (2013.01)

(58) Field of Classification Search
CPC ......... H01L 21/823842; H01L 21/8221; H01L 21/02603
See application file for complete search history.

(56) References Cited

U.S. PATENT DOCUMENTS

| | | |
|---|---|---|
| 8,574,982 B2 | 11/2013 | Erickson et al. |
| 8,896,054 B2 | 11/2014 | Sakuma et al. |
| 8,952,431 B2 | 2/2015 | Guo et al. |
| 8,994,080 B2 | 3/2015 | Guo et al. |
| 9,343,464 B2 | 5/2016 | Erickson et al. |
| 9,564,450 B2 | 2/2017 | Sakuma et al. |
| 9,721,793 B2 | 8/2017 | Smith et al. |
| 9,905,571 B2 | 2/2018 | Sakuma et al. |
| 2009/0267128 A1* | 10/2009 | Maejima ........... H01L 27/11565 257/314 |
| 2011/0204428 A1 | 8/2011 | Erickson et al. |
| 2012/0032274 A1 | 2/2012 | Erickson et al. |
| 2012/0068241 A1 | 3/2012 | Sakuma et al. |
| 2012/0181602 A1* | 7/2012 | Fukuzumi ........... H01L 27/0688 257/326 |
| 2013/0200331 A1* | 8/2013 | Morikawa ........... H01L 27/2454 257/5 |
| 2013/0292755 A1 | 11/2013 | Erickson et al. |
| 2013/0299894 A1 | 11/2013 | Sakuma et al. |
| 2014/0332860 A1 | 11/2014 | Guo et al. |
| 2014/0332862 A1 | 11/2014 | Guo et al. |
| 2015/0048440 A1 | 2/2015 | Sakuma et al. |
| 2015/0187764 A1 | 7/2015 | Guo et al. |
| 2017/0125435 A1 | 5/2017 | Sakuma et al. |
| 2017/0194436 A1* | 7/2017 | Basker ................ H01L 29/0657 |
| 2017/0263651 A1 | 9/2017 | Tochibayashi et al. |
| 2017/0271356 A1* | 9/2017 | Ishida .................... H01L 28/00 |
| 2018/0026042 A1 | 1/2018 | Smith et al. |
| 2018/0211870 A1 | 7/2018 | Chae et al. |

* cited by examiner

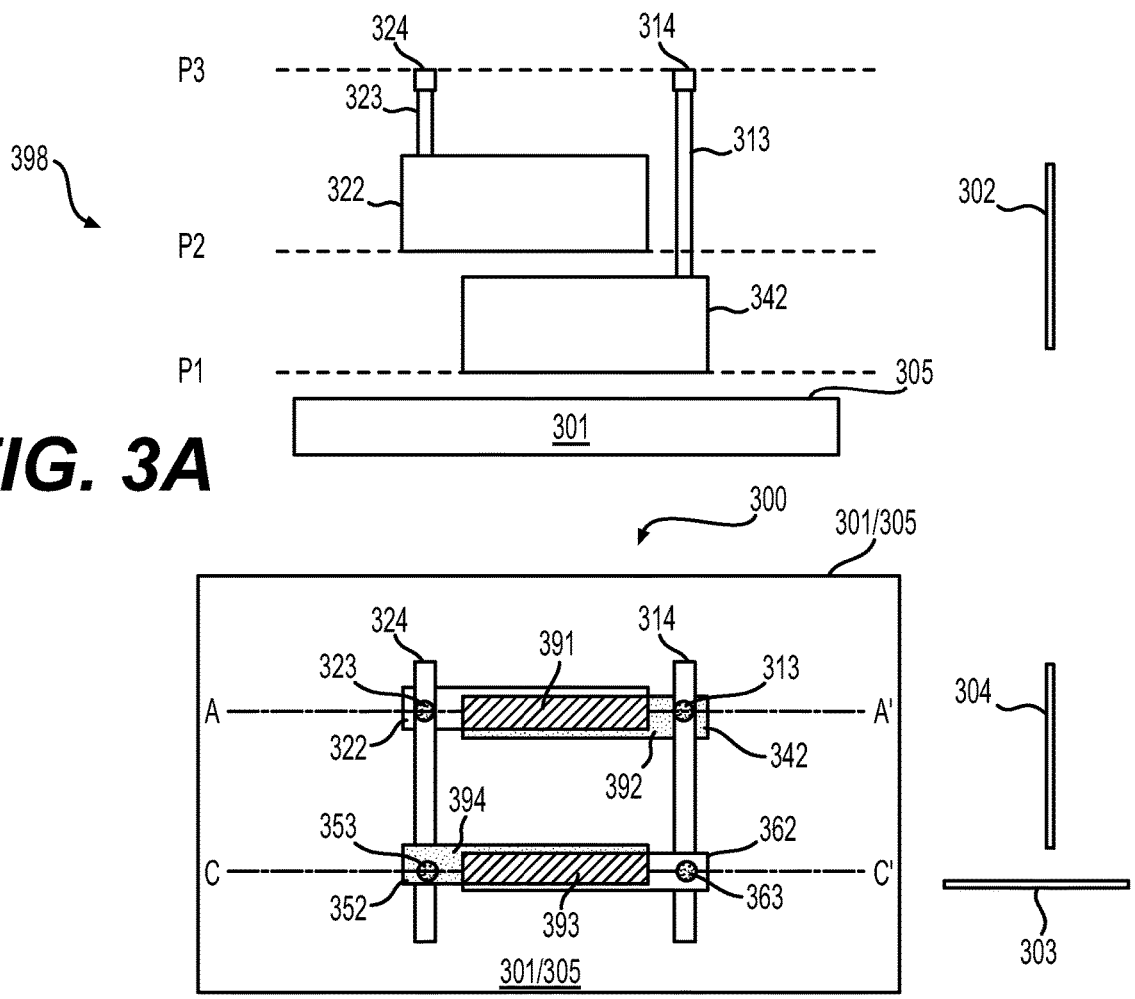
FIG. 3A
FIG. 3B
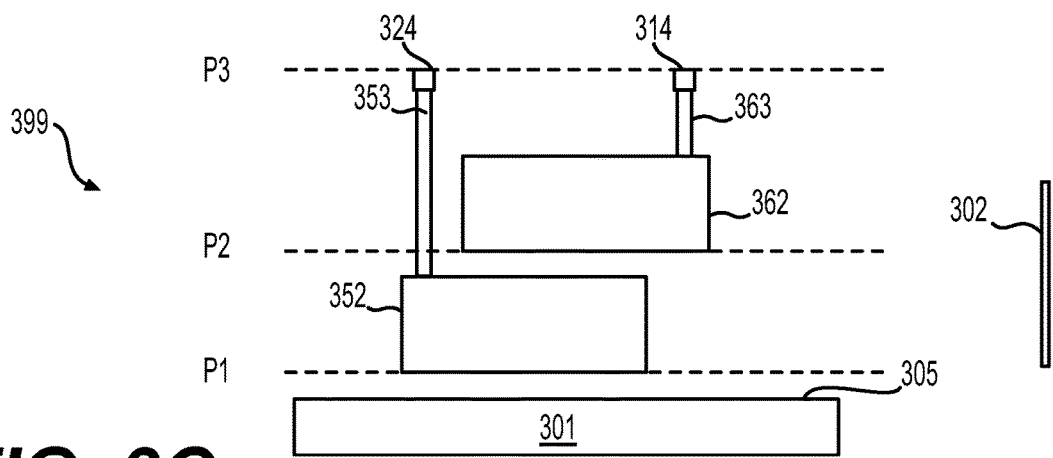
FIG. 3C

SEMICONDUCTOR APPARATUS HAVING STACKED GATES AND METHOD OF MANUFACTURE THEREOF

INCORPORATION BY REFERENCE

This present disclosure claims the benefit of U.S. Provisional Application No. 62/594,354, filed on Dec. 4, 2017, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor devices are widely used in various electronic apparatuses, such as smart phones, computers, and the like. In general, a typical semiconductor device includes a substrate having active devices such as transistors, capacitors, inductors and other components. There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor devices. As dimensions of semiconductor devices scale to smaller sub-micron sizes in advanced technology nodes, it becomes more challenging to increase the density of semiconductor devices. Improved structures and methods for manufacturing same are needed.

SUMMARY

Aspects of the disclosure provide a semiconductor apparatus that comprises a first field-effect transistor (FET) formed on a substrate and comprising a first gate, a second FET stacked on the first FET along a direction substantially perpendicular to the substrate and comprising a second gate. The semiconductor apparatus also comprises a first routing track and a second routing track electrically isolated from the first routing track. Each of the first and second routing tracks is provided on a routing plane stacked on the second FET along said direction. The semiconductor apparatus also comprises a first conductive trace configured to conductively couple the first gate of the first FET to the first routing track, and a second conductive trace configured to conductively couple the second gate of the second FET to the second routing track.

In an embodiment, the second gate is stacked directly above the first gate along the direction substantially perpendicular to the substrate.

In an example, the first and second routing tracks are provided on above the second gate along the direction substantially perpendicular to the substrate.

In an example, the first conductive trace bypasses the second gate and the second FET.

In various embodiments, the semiconductor apparatus further comprises a third FET formed on the substrate and comprising a third gate, a fourth FET stacked on the third FET along the direction substantially perpendicular to the substrate and comprising a fourth gate. The semiconductor apparatus also comprises a third conductive trace configured to conductively couple the third gate of the third FET to the second routing track, and a fourth conductive trace configured to conductively couple the fourth gate of the fourth FET to the first routing track. Further, the fourth gate can be stacked on the third gate along the direction. The third conductive trace can bypass the fourth gate and the fourth FET.

In some embodiments, the second gate is stacked on the first gate and the fourth gate is stacked on the third gate. Further, the first and second tracks are provided on one or more routing planes above the first, second, third, and fourth gates along the direction. The first and second conductive traces are spatially separated, and the first conductive trace bypasses the second gate and the second FET. In addition, the second conductive trace bypasses the first gate and the first FET. The third and fourth conductive traces are spatially separated, the third conductive trace bypasses the fourth gate and the fourth FET, and the fourth conductive trace bypasses the third gate and the third FET. Further, the first and fourth gates are conductively coupled to the first track via the first and fourth conductive traces, respectively, and the second and third gates are conductively coupled to the second track via the second and third conductive traces, respectively.

In an example, at least one of the first and the second gates may include a conductive material having an anisotropic etching property.

In an example, the first and the second FETs are complementary FETs including a n-type FET and a p-type FET.

In an example, a second gate area that is a gate area being a maximum cross-sectional area of the gate intersecting with a plane substantially perpendicular to the direction substantially perpendicular to the substrate, is equal to or larger than a first gate area, and a fourth gate area is equal to or larger than a third gate area, the second gate is staggered above the first gate, and the fourth gate is staggered above the third gate. In another example, a second gate area is less than a first gate area, and a fourth gate area is less than a third gate area, the second gate is staggered above the first gate, and the fourth gate is staggered above the third gate.

In some examples, the first FET further comprises a first set of semiconductor bars stacked along the direction in which the first gate surrounds and is attached to the first set of semiconductor bars, and wherein the second FET further comprises a second set of semiconductor bars stacked along the direction in which the second gate surrounds and is attached to the second set of semiconductor bars. In addition, the second set of semiconductor bars is stacked on the first set of semiconductors bars along the direction.

In an example, at least one of the first gate and the second gate includes a transition metal such as Ruthenium.

In an example, the first gate and the second gate are separated and conductively isolated by a dielectric layer including one or more dielectric materials.

In some examples, at least one of the first gate and the second gate includes a first structure covering at least one of the first set and second set of semiconductor bars, a second structure covering the first structure, and a third structure covering the second structure. Further, the first structure includes a layer having high dielectric constant (high-k layer) and a barrier layer that prevents diffusion between the high-k layer and the second structure, the second structure includes a work-function layer that adjusts a work-function of the respective gate and a blocking layer that prevents diffusion between the work-function layer and the third structure, and the third structure includes one or more conductive materials. The high-k layer can be formed over the at least one of the first set and second set of semiconductor bars using a selective deposition process. The barrier layer can be formed over the high-k layer using a selective deposition process. The second structure can be formed over the first structure using a selective deposition process. In an example, at least one of the selective deposition processes is a selective atomic layer deposition.

BRIEF DESCRIPTION OF THE DRAWINGS

Various embodiments of this disclosure that are proposed as examples will be described in detail with reference to the following figures, wherein like numerals reference like elements, and wherein:

FIGS. 3A-3C show two cross sectional views and a top view of an exemplary semiconductor apparatus according to an embodiment of the disclosure;

DETAILED DESCRIPTION OF EMBODIMENTS

Figure 1A:
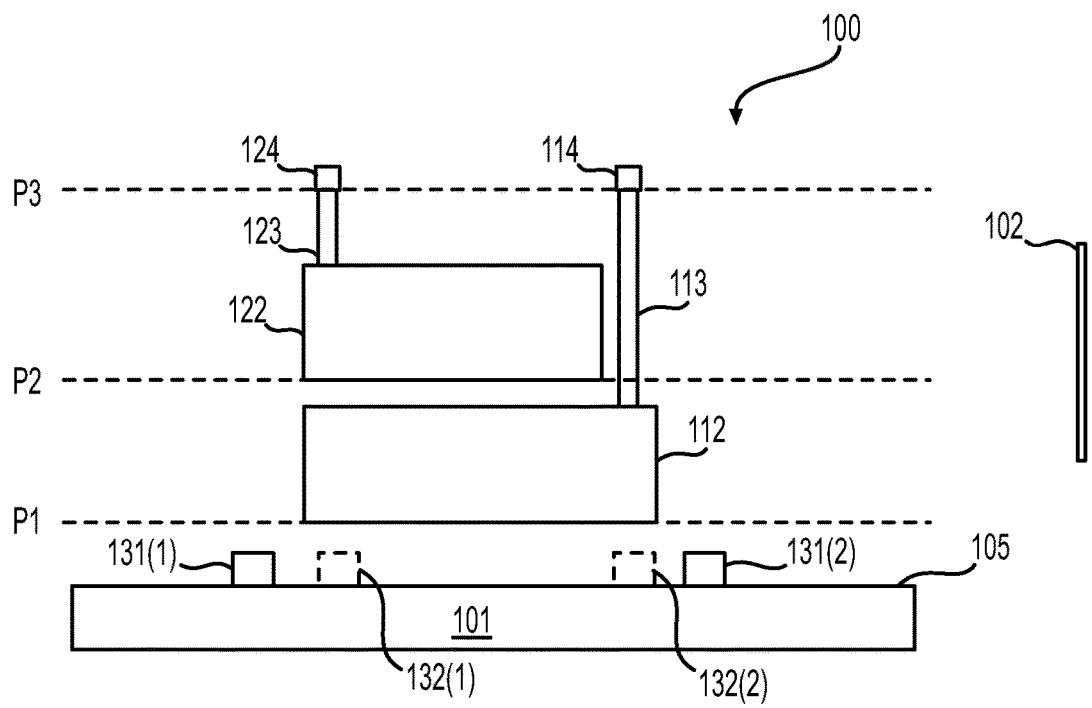
FIG. 1A-1B show a cross sectional and a top view of an exemplary semiconductor apparatus 100 according to an embodiment of the disclosure.

Techniques herein include semiconductor designs as well as corresponding methods of manufacture of a three-dimensional complementary field effect transistor (FET) device. 3D Complementary FET devices (CFET) can include three-dimensionally stacked cells (or standard cells, or logic standard cells) in which the complements n-channel FET, or nFET (such as n-channel metal-oxide-semiconductor FET or NMOSFET or NMOS) and p-channel FET or pFET (such as p-channel metal-oxide-semiconductor FET or PMOSFET or PMOS) are positioned overtop each other. Such vertical stacking (stacking perpendicular to a working surface of a substrate) enables an area-scaling and routing congestion improvement for logic standard cells through "folding" the logic cell onto itself as a three-dimensional design.

3D CFET designs herein provide area scaling and reduction in metallization. Area scaling is realized by the placement of, for example, either NMOS or PMOS source and drain as well as gate on top of each other instead of being positioned laterally across from its complement. For example, in planar CFET devices, NMOS is positioned in one area of a wafer while PMOS is positioned in a different area of the wafer. Another benefit of 3D CFET logic standard cells herein is that the source and drain electrodes can be staggered or "stair-cased" as a mechanism that enables access to either lower or upper source and drain electrodes from a common routing line or routing track. Such configuration avoids the need for additional metallization that would be required in planar CFET devices to create nFET to pFET crossing. With designs herein, such nFET and pFET crossing is created internal within a device.

There is a benefit in accessing either upper or lower source and drain electrodes to a single routing track using CFET cell designs for simple cells such as AND-OR-Invert (AOI) cells. In an example, a routing track can be connected to both the upper source and drain electrode, or upper metal drain (MD) as well as the lower source and drain electrode, or lower metal drain (MD).

Technologies to stack or stair-case source and drain electrodes include a means to selectively deposit dielectric material such as SiO, SiOC, SiOCN, SiON, SiN, AlO, HfO, and SiC, and doped versions of each, onto common conductors used in the metallization of source and drain contacts which can include tungsten, copper, cobalt, and ruthenium. Another technique includes a method to pattern a stair-case orientation of the bottom source and drain electrode with respect to the upper source and drain electrode which can optionally include the application of a reverse contact application. Another technique is a method to create metal depositions with fine precision to final height of the metal. There are a few techniques for such precision deposition such as using a bottom-up chemical vapor deposition (CVD) process or a metal deposition by CVD, physical vapor deposition (PVD), or atomic layer deposition (ALD) with good void and seam control. Another technique is used to form buried power rails (or rails) and form connections between the rails and corresponding upper or lower source and drain metal contact.

Extending CFET designs from relatively simple cells such as AOI cells to more complex cells such as flip-flops and latches show that staggering or stair-casing of the source-and-drain electrodes is a component of a larger solution to maintain efficient area scaling. For the case of an AOI cell, one technique is reducing the area of a cell to as few as the pitch of three routing tracks (3T), referred to as a cell height of 3T. To area scale a more complex cell, such as a flip-flop, techniques can reduce the number of routing tracks to a minimum. For example, a four routing track (4T) cell height is used in conjunction with buried power rails. For embodiments of an AOI cell, the source and drain electrodes can be staggered to enable both nFET and pFET connections up to a single routing track. Functioning of transistors can occur through a common gate for both NMOS and PMOS. This means that a single gate structure contains both gate-all-around NMOS and PMOS channels. Thus a single connection to the common gate is used.

Although techniques herein can be used for many types and configurations of semiconductor devices, example embodiments herein describe a 3D CFET integration method for more complex cell designs in which connections to a single routing line are used not only for staggered NMOS and PMOS source and drain electrodes, but also for staggered NMOS and PMOS gates as well. In examples herein, the staggered or stair-cased NMOS and PMOS gates are referred to as split gates since there is a dielectric barrier (or dielectric separation layer) physically and electrically separating the NMOS and PMOS gates from one another. In the staggered configuration, connections of both individual NMOS and PMOS gates can be made to a common routing track.

Embodiments herein also show integration methods for fabrication of a split gate in an exemplary device. The main challenge with having individual, staggered nFET and pFET gates within a 3D CFET device is that the channels are already formed when the gate structure including metallization is formed, which does not occur for the source and drain regions of a cell. Forming staggered source and drain nFET and pFET electrodes benefits from the channel still being embedded within the gate low-k spacer (or the low-k gate spacer, or the low-k spacer) and not suspended within the opened contact region. The source and drain can be formed from the embedded channel and then metalized. This flow can be sequential for both the lower source and drain electrode and also for the upper source and drain electrode. By executing the source and drain growth and metallization sequentially for nFET and pFET, this enables a dielectric film to be deposited between each channel to provide adequate separation. For the metal gate, this can become problematic given that the channel is present within the replacement gate as a set of suspended semiconductor bars including sheets and/or wires, and this is taken into consideration in the integration approaches to avoid shorting the nFET and pFET gates together because a process executed for either nFET or pFET region of the gate can be simultaneously done to the complementary gate.

Example embodiments herein focus on incorporating a 3D CFET device in which one or more of the nFET or pFET transistors are vertically stacked overtop one another in a 3D CFET design, the individual nFET and pFET gates are staggered or stair-cased with respect to one another such that access to either gate is possible by one or more routing tracks, for example, in the back-end-of-line (BEOL) metallization, and that the staggering or stair-casing of the individual nFET and pFET gates can be done to provide access to a common routing track in the BEOL.

In general, a common gate can also be used in cell designs. Therefore, a combination of split gates and common gates can be used in designing a complex standard cell. A common gate in this disclosure is referred to as a gate in which nFET and pFET transistors share a common gate structure so that a connection to the common gate turns both the nFET and pFET gates either on or off. For the case of the split gate, stacked gates can have independent connections, for example, to be connected to different electrical signals.

In an embodiment, semiconductor devices, such as transistors, can be arranged in relation to a substrate plane, such as a planar working surface of a substrate. A first semiconductor device can be formed on a plane parallel to the substrate plane, and a second semiconductor device can be formed on a different plane also parallel to the substrate plane in order to increase a number of semiconductor devices per unit area of the substrate plane. The second semiconductor device can be stacked over the first semiconductor device along a first direction perpendicular to the substrate plane. According to some embodiments, the first semiconductor device can be a first FET, and the second semiconductor device can be a second FET. A second gate of the second FET can be further stacked over and separated from a first gate of the first FET along the first direction. In order to conductively couple the first gate and the second gate to different electric signals, a first via-to-gate connection, or conductive trace can be configured to couple the first gate to a first routing track, and a second conductive trace can be configured to couple the second gate to a second routing track. In an embodiment, the first and second routing tracks conduct separate electric signals, and are located on a plane above the first and second gate along the first direction. Further, a routing track can be conductively coupled to multiple gates including gates of n-type FETs (nFETs) formed on a plane parallel to the substrate plane and gates of p-type FETs (pFETs) formed on another plane parallel to the substrate plane, alleviating routing congestions.

Figure 1B:
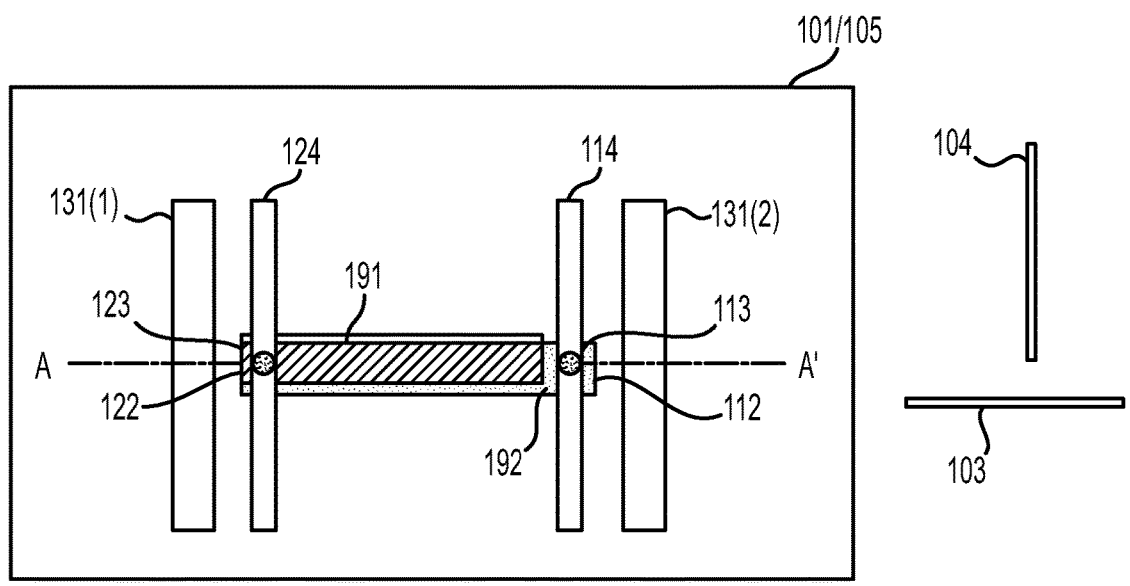

FIGS. 1A-1B show a cross sectional and a top view of an embodiment of a semiconductor apparatus 100 according to some embodiments. The cross sectional view of the semiconductor apparatus 100 in FIG. 1A is sectioned along AA' in FIG. 1B. In an embodiment, the semiconductor apparatus 100 includes a stack of FETs having a first and a second FET. The first FET is formed on a first plane P1 parallel to a substrate plane 105 of a substrate 101. The second FET is formed on a second plane P2 parallel to the substrate plane 105. Further, the second FET is stacked over the first FET along a first direction 102 perpendicular to the substrate plane 105. The first FET can include a first set of semiconductor bars and multiple terminals, such as a first source, a first drain, a first gate 112, and the like. The first gate 112 can be formed over the first set of semiconductor bars. The second FET can include a second set of semiconductor bars and multiple terminals, such as a second source, a second drain, a second gate 122, and the like. The second gate 122 can be formed over the second set of semiconductor bars. A first channel can be formed based on the first set of semiconductor bars when the first FET is in operation. Similarly, a second channel can be formed based on the second set of semiconductor bars when the second FET is in operation. Therefore, the first set of semiconductor bars is referred to as the first channel, and the second set of semiconductor bars is referred to as the second channel.

Referring to FIG. 1A, the first gate 112 is formed on the first plane P1, and the second gate 122, stacked above and spatially separated from the first gate 112, is formed on the second plane P2. The first gate 112 and the second gate 122 overlap, resulting in an overlapped area 191 (i.e., designated by cross-hatch) between the first gate 112 and the second gate 122, as seen in the top view of FIG. 1B. In order to conductively couple the first and second gate 112 and 122 to different electric signals, separate conductive traces can be employed to connect the first and second gate 112 and 122 to separate routing tracks. For example, each routing track can conduct a different electric signal. Referring to FIGS. 1A-1B, a first conductive trace 113 can be configured to connect the first gate 112 to a first routing track 114, and a second conductive trace 123 can be configured to connect the second gate 122 to a second routing track 124. The first and second routing tracks 114 and 124 are located above the first and second gate on a third plane P3 parallel to the substrate plane 105. In an example, one or more portions of the first and second routing tracks 114 and 124 are substantially parallel to a first axis 104 shown in FIG. 1B. The first axis 104 is parallel to the substrate plane 105.

In some embodiments, the first gate 112 and the second gate 122 form split gates. Split gates can refer to a stack of gates separated physically and electrically, and can be conductively connected to separate routing tracks via separate conductive traces.

A routing track can be located in any suitable locations of the semiconductor apparatus 100, such as a plane above (FIG. 1A) or a plane below the stack of FETs. A routing track can have any suitable structure and materials. In an embodiment, a routing track can be conductively coupled to multiple terminals, such as gates, sources, drains, or the like of various FETs and semiconductor devices, or any suitable combination thereof. In an embodiment, additional routing tracks can be included in the semiconductor apparatus 100 to conduct additional electric signals. For example, four routing tracks can be used in a standard cell, such as a flip-flop. In an example, multiple routing tracks can be conductively coupled to conduct the same electric signal.

The semiconductor apparatus 100 can include one or more power rails, such as a first and second power rail 131(1)-(2) to provide power supply to the semiconductor apparatus 100, such as to supply a positive voltage and a negative voltage to the semiconductor apparatus 100. In an example not shown, power rails can be located in a same plane where the routing tracks are positioned, such as the third plane P3. In another example, power rails can be located in one or more planes different from where the routing tracks are, thus, the routing tracks can be stacked above or below power rails to reduce an area occupied by the semiconductor apparatus 100 and increase the number of semiconductor devices per unit area of the substrate plane 105. Referring to 1A-1B, the first and second power rail 131(1)-(2) are located beneath the third plane P3 and in the substrate plane 105. To reduce the area occupied by the semiconductor apparatus 100, the first and second power rail can, alternatively, be positioned at locations indicated by 132(1)-(2).

In an embodiment, the first and second FET are CFETs having an nFET and a pFET. For example, the first FET is an nFET, and the second FET is a pFET.

In some examples, one or more FETs can be stacked above the second FET. Further, one or more gates can be stacked above the second gate 122. Each gate can be coupled to a different electric signal by using a different conductive trace configured to connect each gate to a different routing track.

In an embodiment described above, the second gate 122 is sandwiched between the third plane P3 where the first routing track 114 is positioned and the first gate 112. In order for the first conductive trace 113 to bypass the second gate 122 when connecting the first routing track 114 on the third plane P3 and the first gate 112, the first and second gate 112 and 122 can be staggered with respect to each other. When the first and second gate 112 and 122 are staggered, an exposed area 192 on the first gate 112 can be used to connect the first conductive trace 113 to the first gate 112, as seen in the top view of FIG. 1B. In addition to the exposed area 192, there exists the overlapped area 191 when the first and second gates are staggered. In an example, the second conductive trace 123 can be positioned at any suitable locations on the second gate 122, and the first conductive trace 113 can be positioned at any suitable locations in the exposed area 192 on the first gate 112. In an example, locations of the first and second conductive traces 113 and 123 can be adjusted according to the locations of the routing tracks 114 and 124.

In an embodiment shown in FIGS. 1A-1B, a second cross sectional area of the second gate 122 is set to be smaller than a first cross sectional area of the first gate 112, resulting in the first and second gate, 112 and 122, respectively, being staggered. In the example shown in FIG. 1A-1B, a cross sectional area of a gate is the largest cross sectional area when the gate is sliced with planes parallel to the substrate plane 105.

Figure 2A:
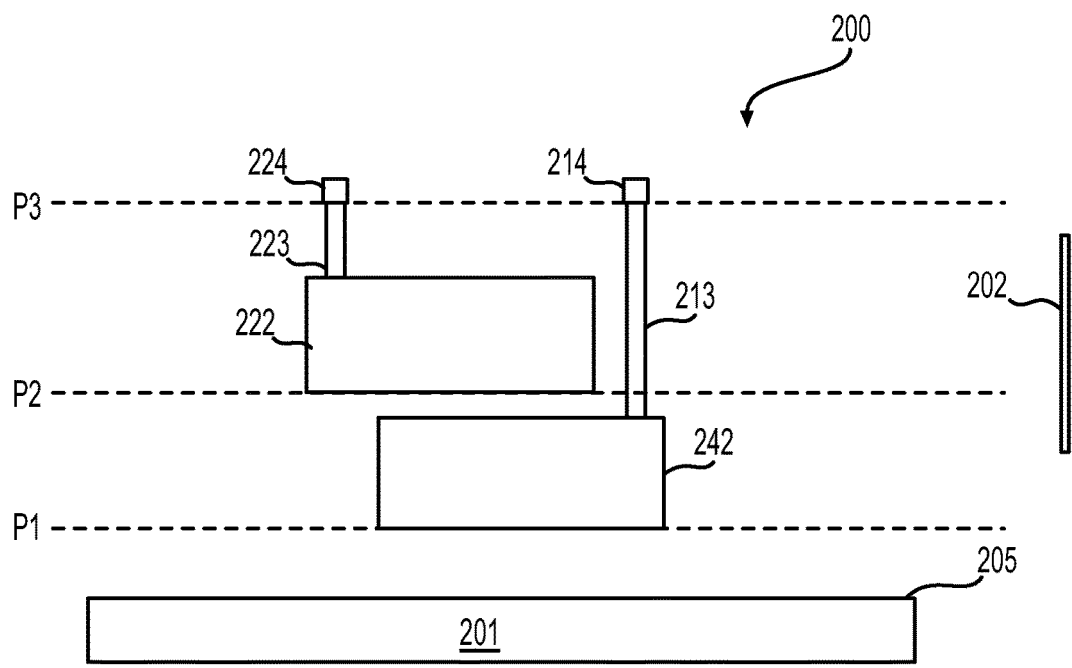
FIGS. 2A-2B show a cross sectional and a top view of an exemplary semiconductor apparatus according to an embodiment of the disclosure.
Figure 2B:
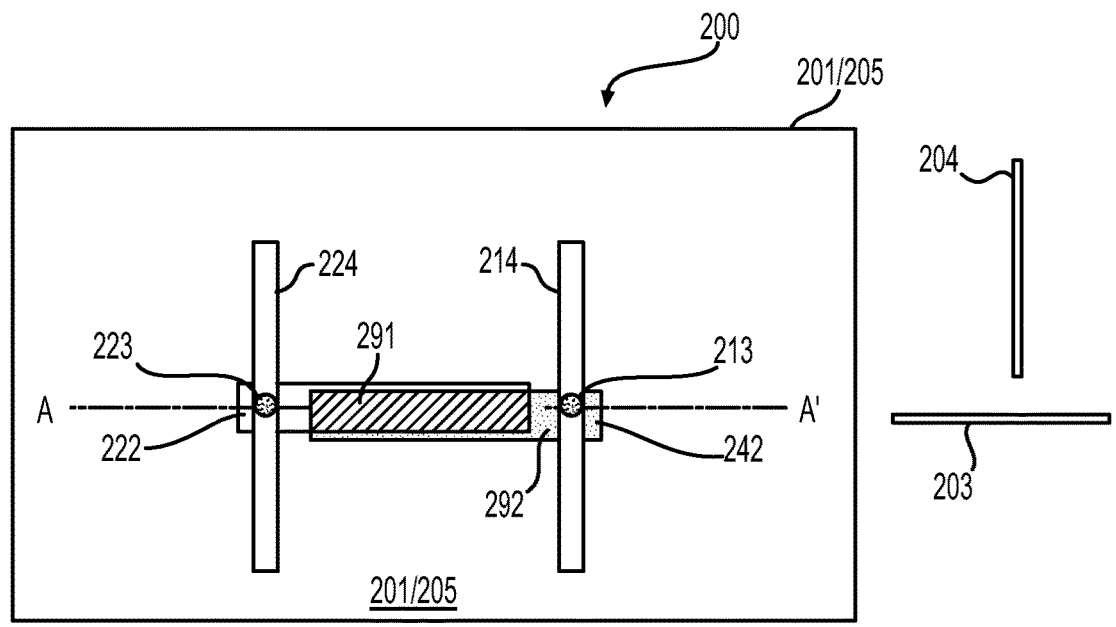

In an embodiment, the second cross sectional area is equal to or larger than the first cross sectional area. Thus, the second gate can be shifted with respect to the first gate along one or more axes parallel to the substrate plane so that the first and second gate are staggered. An example is shown in FIGS. 2A-2B. FIGS. 2A-2B show a cross sectional and a top view of an exemplary semiconductor apparatus 200 according to some embodiments. The cross sectional view of the semiconductor apparatus 200 in FIG. 2A is sectioned along AA' of FIG. 2B. The semiconductor apparatus 200 includes a stack of FETs having a first and second FET, a first and a second conductive trace 213 and 223, a first and second routing track, 214 and 224, respectively, and one or more power rails, and the like.

The semiconductor apparatus 200 includes similar structure and components as those of the semiconductor apparatus 100 described in FIGS. 1A-1B. A component 2xx in FIGS. 2A-2B is identical to a component 1xx in FIGS. 1A-1B where xx is a number from 01 to 24, and thus, the description of the components in FIGS. 2A-2B that are identical to those in FIGS. 1A-1B is omitted for purposes of clarity.

Different aspects between the semiconductor apparatuses 100 and 200 are described below. In the semiconductor apparatus 200, the second cross sectional area of the second gate 222 is set to be equal to or larger than that of the first gate 242. Therefore, the second gate 222 in FIGS. 2A-2B is staggered with respect to the first gate 242 by shifting the second gate 222 with respect to the first gate 242 along one or more axes parallel to the substrate plane 205, such as along an axis 203 and 204, resulting in an exposed area 292 on the first gate 242. The first gate 242 and the second gate 222 also overlap, resulting in an overlapped area 291 (i.e., designated by cross-hatch). The first conductive trace 213 can be positioned above the exposed area 292 to conductively couple the first gate 242 to the first routing track 214 and to bypass the second gate 222. The first gate 242 and the second gate 222 form split gates.

An upper gate, such as the second gate 222, has the advantage of being able to connect to multiple routing tracks given a position of the upper gate overtop a bottom gate, such as the first gate 242. However, the bottom gate can be staggered with respect to the upper gate so that the bottom gate can have connections to, for example, up to two different routing tracks. Referring to FIG. 2A, the upper gate (i.e., the second gate 222) is positioned to the left of the first gate 242, and thus, the bottom gate (i.e., the first gate 242) connects to the routing track 214. In another example not shown in FIG. 2A, the first gate 242 can connect to the routing track 224 when the upper gate (i.e., the second gate 222) is positioned to the right of the first gate 242.

In an embodiment, a routing track can be conductively coupled to multiple components of semiconductor devices formed on different planes parallel to the substrate plane. For example, the multiple components of semiconductor devices can include nFET source and drain, pFET source and drain, a merged nFET and pFET source and drain, a common gate, an nFET gate or a gate of nFET, a pFET gate or a gate of pFET, and the like. Referring to FIGS. 3A-3C, gates of nFETs and pFETs can be formed in different planes parallel to the substrate plane, and share or access a same routing track, thus, alleviating the need for additional metallization, such as nFET to pFET crossing, and reducing routing congestion.

FIG. 3A-3C show two cross sectional views and a top view of a semiconductor apparatus 300 according to some embodiments. The cross sectional views of the semiconductor apparatus 300 in FIGS. 3A and 3C are sectioned along AA' and CC' of FIG. 3B, respectively. The semiconductor apparatus 300 includes two stacks of FETs, a first stack of FETs 398 including a first and second FET shown in FIG. 3A and the top portion of FIG. 3B, and a second stack of FETs 399 including a third and fourth FET shown in FIG. 3C and the bottom portion of FIG. 3B. The semiconductor apparatus 300 also includes a first, a second, a third, and a fourth conductive trace, 313, 323, 353, and 363, respectively, a first and second routing track, 314 and 324, respectively, one or more power rails (not shown), and the like. In an example, the semiconductor apparatus 300 can be a part of a standard cell.

The first stack of FETs 398 in the semiconductor apparatus 300 includes the same structure and components as those of the stack of FETs in the semiconductor apparatus 200 shown in FIGS. 2A-2B. A component 3xx in FIG. 3A-3B is identical to a component 2xx in FIGS. 2A-2B where xx is a number from 01 to 42 and from 91 to 92, and thus, the description of the components in the first stack of FETs 398 in FIG. 3A is omitted for purposes of clarity.

The semiconductor apparatuses 300 further includes the second stack of FETs 399 where the third FET is formed on the first plane P1, and the fourth FET is formed on the second plane P2. Further, the fourth FET is stacked above the third FET along the vertical direction 302. The components of the third and fourth FETs are identical to those of the first and second FETs, and thus, the description of the components is omitted for purposes of clarity. Similar to the first stack of FETs 398 shown in FIG. 3A, the fourth gate 362 is stacked above and spatially separated from the third gate 352. The fourth cross sectional area of the fourth gate 362 can be the same as or larger than that of the third gate 352. Therefore, the fourth gate 362 is staggered with respect to the third gate 352 by shifting the fourth gate 362 along one or more axes parallel to the substrate plane 305, such as along an axis 303 and 304, resulting in an exposed area 394 on the third gate 352. The third conductive trace 353 can be positioned above the exposed area 394 to conductively couple the third gate 352 to the second routing track 324 and to bypass the fourth gate 362. The fourth conductive trace 363 is configured to conductively couple the fourth gate 362 to the first routing track 314. The first gate 342 and the second gate 322 form split gates. The third gate 352 and the fourth gate 362 form split gates.

As shown in FIGS. 3A-3C, multiple terminals, such as the first and fourth gate, 342 and 362, respectively, from the first and second stacks of FETs, 398 and 399, respectively, can share the same routing track, such as the first routing track 314. Further, the multiple terminals sharing the same routing track, such as the first and fourth gate, 342 and 362, respectively, can be formed in different planes parallel to the substrate plane 305, such as the first plane P1 and the second plane P2. The multiple terminals sharing the same routing track can be from both nFETs and pFETs. As described above, accessing gates of nFETs and pFETs located in different planes from the same routing track can alleviate routing congestion.

As described above, additional routing tracks can be used to conduct more electrical signals. For example, two more routing tracks parallel to the routing tracks 314 and 324 can be positioned between the routing tracks 314 and 324 and above the overlapped areas 391 (i.e., designated by cross-hatch) and 393 (i.e., designated by cross-hatch). Upper gates formed in the second plane P2, such as the second gate 322 and the fourth gate 362, can access the two additional routing tracks and one of the routing tracks 314 and 324. In an example, lower gates formed in the first plane P1, such as the first gate 342 and the third gate 352, cannot access the two additional routing tracks. Instead, a lower gate, such as the first gate 342 and the third gate 352, can access one of the routing tracks 314 and 324 depending on orientation of the lower gate with respect to the upper gate in respective split gates.

As described above, a routing track can be connected to bottom source and drain electrodes and upper source and drain electrodes. The routing track can be connected to a bottom gate of a set of split gates, and an upper gate of another set of split gates. Additional bottom gates of split gates and additional upper gates of split gates can also be connected to the routing track. Further, the routing track can be connected to a common gate. A complex standard cell design, such as the flip flop, can use both common gates and split gates where nFET and pFET gates are stacked overtop one another, but with individual connections to respective routing tracks, including a common routing track.

Figure 4:
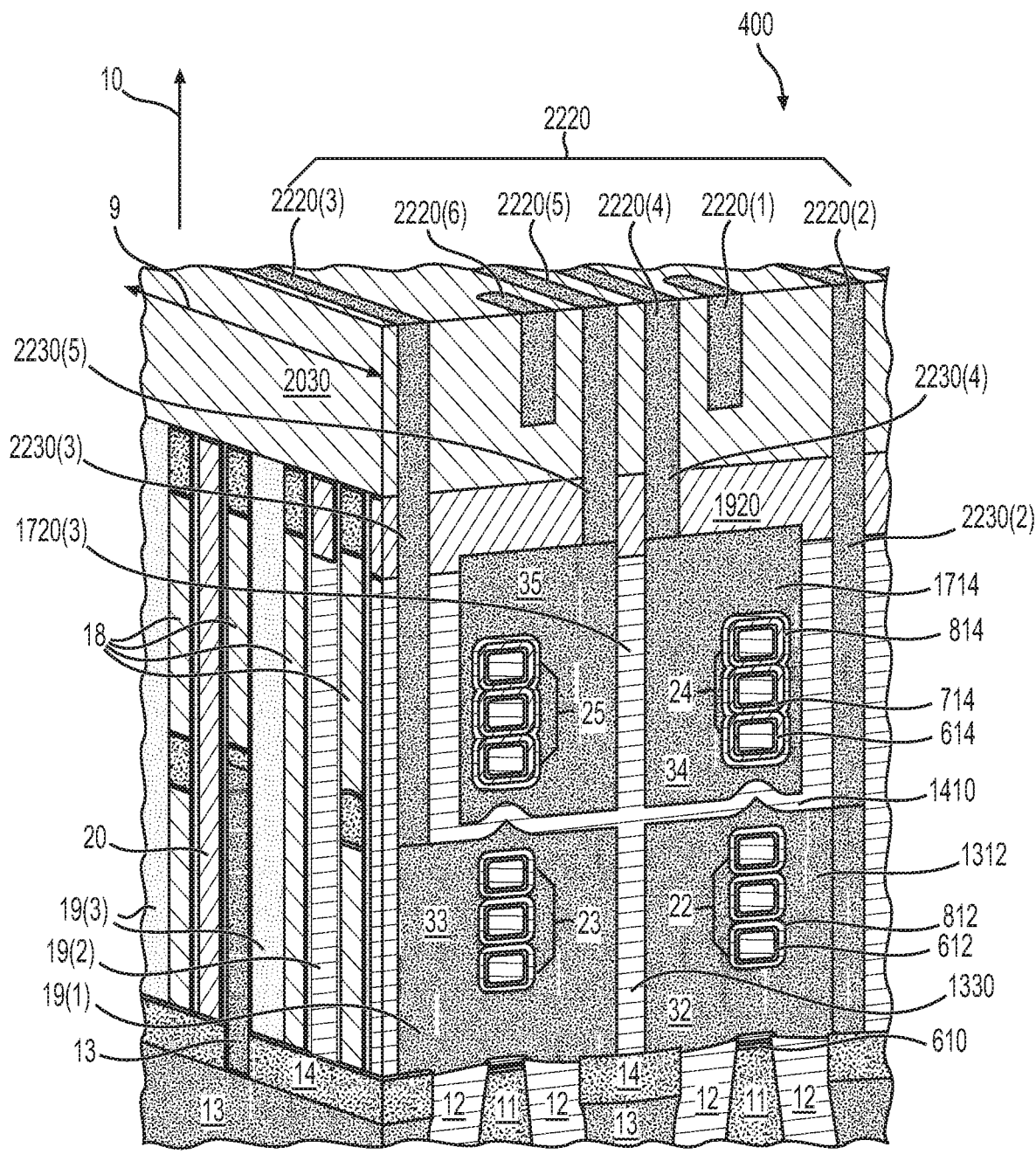
FIG. 4 shows a perspective view of an exemplary semiconductor apparatus according to an embodiment of the disclosure.

FIG. 4 shows a perspective view of a semiconductor apparatus 400 according to an embodiment of the disclosure. The semiconductor apparatus 400 includes two stacks of FETs separated by, for example, one or more dielectric materials located in trenches 1330 and 1720(3). A first stack of FETs includes a first FET and a second FET. The first stack of FETs can include the same structure and components as those of the stack of FETs in the semiconductor apparatus 100 shown in FIG. 1A-1B. The first FET includes a first gate 32 and a first set of semiconductor bars 22 or a first channel 22. The second FET includes a second gate 34 and a second set of semiconductor bars 24 or a second channel 24. The second gate 34 formed on a second plane is stacked above the first gate 32 formed on a first plane along a first direction 10. The second gate 34 is physically separated from the first gate 32 using a dielectric separation layer 1410. Further, the first gate 32 and the second gate 34 are staggered with respect to each other. The first gate 32 is conductively coupled to a routing track 2220(2) via a conductive trace 2230(2). The second gate 34 is conductively coupled to a routing track 2220(4) via a conductive trace 2230(4). The first gate 32 and the second gate 34 form split gates.

Similarly, the second stack of FETs includes a third FET and a fourth FET. The third FET includes a third gate 33 and a third set of semiconductor bars 23 or a third channel 23. The fourth FET includes a fourth gate 35 and a fourth set of semiconductor bars 25 or a fourth channel 25. The fourth gate 35 formed on the second plane is stacked above the third gate 33 formed on the first plane along the first direction 10. The fourth gate 35 is physically separated from the third gate 33 using the dielectric separation layer 1410. Further, the third gate 33 and the fourth gate 35 are staggered with respect to each other. The third gate 33 is conductively coupled to a routing track 2220(3) via a conductive trace 2230(3). The fourth gate 35 is conductively coupled to a routing track 2220(5) via a conductive trace 2230(5). The third gate 33 and the fourth gate 35 form split gates.

Gates formed on the first plane, such as the first gate 32 and the third gate 33, are referred to as lower gates, and gates formed on the second plane, such as the second gate 34 and the fourth gate 35, are referred to as upper gates. Similarly, FETs having the lower gates are referred to as lower FETs, and FETs having the upper gates are referred to as upper FETs.

The semiconductor apparatus 400 also includes power rails (or buried power rails) 13 covered with interconnect caps (or buried power rail caps) 14, substrate strips 11 isolated from the power rails 13 by shallow trench isolations (STIs) 12. In an example, the substrate strips 11 can be a portion of a substrate (not shown) of the semiconductor apparatus 400. The semiconductor apparatus 400 also includes a gate cap layer 1920 to isolate the upper gates 34 and 35 from other components of the semiconductor apparatus 400. The routing tracks 2220 are formed in a dielectric layer 2030.

In an example, the first stack of FETs can be part of a first standard cell, such as a flip-flop including three routing tracks 2220(1)-(2) and 2220(4). The second stack of FETs can be part of a second standard cell including three routing tracks 2220(3) and 2220(5)-(6). The routing tracks 2220 are parallel to a second direction 9. Additional routing tracks (not shown) can be included in the first and the second standard cells. The first to fourth gates 32, 34, 33, and 35, respectively are located within a region 19(1). Additional gates can be located in regions 19(2)-(3), and share the routing tracks 2220.

The semiconductor apparatus 400 can include any suitable number of standard cells, and any suitable number of FETs and other components including power rails, routing tracks, and the like. The regions 19(1)-(3) are separated by structures 18 including one or more dielectric materials. In some examples, the structures 18 can include source-and-drain contacts that are separated from the regions 19(1)-(3) through a low-k dielectric material. A diffusion break 20 including one or more dielectric materials can also be included to separate, for example, adjacent standard cells. In an example, formation of the diffusion break 20 is described in U.S. Pat. No. 9,721,793, which is incorporated herein by reference in its entirety. The semiconductor apparatus 400 can include any suitable number of the regions 19(1)-(3) separated by any suitable number of the structures 18 and the diffusion breaks 20. Additional split gates are located within the region 19(2). In addition to split gates, the semiconductor apparatus 400 can also include a stack of FETs sharing a common gate. The common gate refers to gates of a stack of FETs physically connected and conductively coupled to form a common gate structure, thus, any connection to the common gate structure can turn the gates either on or off. Referring to FIG. 4, common gates are located within the regions 19(3). In an embodiment, a third stack of FETs including a fifth gate (a lower gate) formed on the first plane and a sixth gate (an upper gate) formed on the second plane, similar to the second stack of FETs is located within the region 19(2). The fifth gate is connected to the routing track 2220(4), and the sixth gate is connected to the routing track 2220(2). In an example, the upper FETs are p-type and the lower FETs are n-type, and thus, the routing track 2220(2) can be connected to both nFETs and pFETs, alleviating the routing congestion.

The substrate can be any suitable semiconductor material, such as silicon (Si), silicon carbide (SiC), sapphire, germanium (Ge), gallium arsenide (GaAs), silicon germanium (SiGe), indium phosphide (InP), diamond, and the like. The substrate can be doped with an n-type and a p-type impurity. The substrate can include various layers, such as conductive or insulating layers formed on a semiconductor substrate, a silicon-on-insulator (SOI) structure, and the like. The substrate can also be strained.

The power rails 13 can provide suitable power supplies, such as positive and negative power supplies, to the semiconductor apparatus 400. The power rails 13 can be formed by any suitable one or more conductive materials, such as ruthenium (Ru), copper (Cu), and the like. The power rails 13 can be formed using any suitable structure, such as disclosed in U.S. patent application Ser. No. 15/875,442, filed on Jan. 19, 2018 which is incorporated herein by reference in its entirety. As described above, the power rails 13 can be formed in any suitable plane, such as that shown in FIG. 4, or formed on the same level as the routing tracks 2220, or the like.

The interconnect caps 14 can isolate the power rails 13 from FETs and the like. The interconnect caps 14 can include one or more dielectric materials fabricated in any suitable structures. The interconnect caps 14 can include materials such as SiO, SiCO, SiCN, SiC, SiN, and the like.

The STIs 12 can prevent electric current leakage, for example, between the power rails 13 and the substrate strips 11. The STI 12 can be fabricated using any suitable one or more dielectric materials and any suitable structure. The STIs can include $SiO_2$, silicon nitride, silicon oxynitride, fluorine-doped silicate glass (FSG), phosphosilicate glass (PSG), borophosphosilicate glass (BPSG), a low-k dielectric, other suitable materials, or combinations thereof, and/or other suitable material know in the art.

The second stack of FETs and other FETs having split gates are similar to the first stack of FETs in terms of the structure and materials. Therefore, the description is given to the first stack of FETs for purposes of clarity. The first FET includes a first source, a first drain, the first channel 22, and the first gate 32. The second FET includes a second source, a second drain, the second channel 24, and the second gate 34. The first and second sources and the first and second drains can have any suitable semiconductor material or combination of semiconductor materials, such as Si, AlGaAs, Ge, GaAs, GaAsP, SiGe, InP, and the like. In an embodiment, the second source and drain can be positioned over the first source and drain, such as disclosed in U.S. patent application Ser. No. 15/654,327, filed on Jul. 19, 2017 which is incorporated herein by reference in its entirety.

As described above, the first channel 22 can include any suitable structure and material systems to provide a semiconductor channel when the first FET is in operation. The second channel 24 can include any suitable structure and material systems to provide a semiconductor channel when the second FET is in operation. The first channel 22 and the second channel 24 can have any suitable semiconductor material, including an elementary semiconductor such as silicon, germanium, or the like, a compound semiconductor such as silicon carbide, gallium arsenide, gallium phosphide, indium phosphide, indium arsenide, or the like, an alloy semiconductor such as silicon germanium, or a combination thereof. In an example, the first and second channels 22 and 24 include different semiconductor materials.

Figure 5:
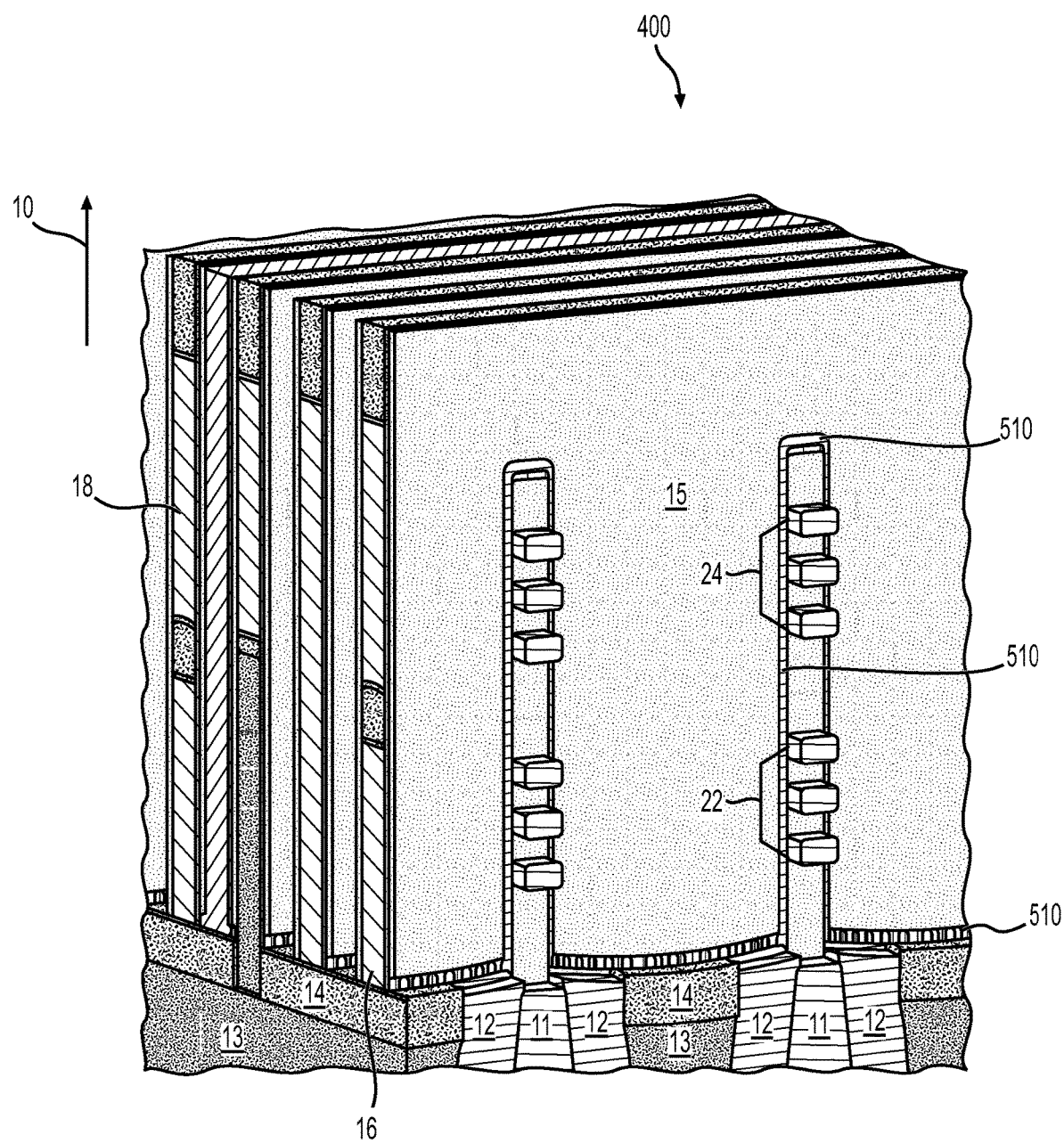
FIGS. 5-21 show exemplary schematic views of various intermediary steps of a manufacturing process according to some embodiments of the disclosure.

The first channel 22 and the second channel 24 can include any suitable structure, such as one or more semiconductor bars. In an example, a semiconductor bar can be a nanowire, a nanosheet, any other suitable shape, or the like. The first and second channel 22 and 24 can be physically separated. Referring to FIG. 5, which illustrates an example structure, three nanosheets are stacked along the first direction 10 to form the first channel 22 or the second channel 24. Further, the second channel 24 is stacked over and physically separated from the first channel 22 along the first direction 10. In an example, the first channel 22 includes Si, and the second channel 24 includes SiGe.

The first FET can be a pFET having a p-channel, and the second FET can be a nFET having a n-channel. Alternatively, the first FET can be a nFET having a n-channel, and the second FET can be a pFET having a p-channel. In the present disclosure, the first channel 22 as a n-channel in a nFET and the second channel 24 as a p-channel in a pFET in operation are used as an example, the disclosure can be suitably modified to apply to, for example, the first channel 22 as a p-channel in a pFET and the second channel 24 as a n-channel in a nFET in operation.

The first gate 32 can be formed over the first channel 22. The second gate 34 can be formed over the second channel 24. The first and second gate 32 and 34 can include any suitable semiconductor gate structures and material systems used for a nFET and a pFET, respectively. The first gate 32 can cover the first channel 22 and the second gate 34 can cover the second channel 24 in any suitable configuration, such as that used in Fin FET (FinFET), Gate All Around (GAA), tri-gate, Pi-gate, and the like. The gate materials can surround the channel on all sides in the GAA configuration.

Referring to FIG. 4, the first gate 32 includes a first structure 612, a second structure 812, and a third structure 1312. The first structure 612 can include a high-dielectric (high-k) layer (or high-k film or high-k films) as a gate insulator over the first channel 22 and a barrier layer over the high-k layer. The high-k layer can include any suitable dielectric material having a high dielectric constant, such as hafnium oxide (HfO). The barrier layer can be any suitable dielectric material, such as TiN, preventing diffusion between the high-k layer and a work-function (WF) layer or a WF structure used in the second gate 34. The second structure 812, covering the first structure 612, can include a WF layer and a blocking layer. The WF layer can adjust the work-function and affect a threshold voltage of the first gate 32, and can include AlTiC and AlTiO. In general, the WF layer can include any suitable work function materials and is not limited to AlTiC and AlTiO. The blocking layer can have any suitable materials, such as TiN, to prevent diffusion between the WF layer and the third structures 1312. The third structure 1312, covering the second structure 812, can include any suitable one or more conductive materials as a gate fill, such as a transition metal including Ru.

The second gate 34 includes a first structure 614, a WF structure 714, a second structure 814, and a third structure 1714. Referring to FIG. 4, the first structure 614, the second structure 814, and the third structure 1714 of the second gate 34 can be identical to the first structure 612, the second structure 812, and the third structure 1312 of the first gate 32, respectively. In order to adjust the work-function of the second gate 34, the WF structure 714 can be inserted between the first structure 614 and the second structure 814. In an example, the WF structure 714 can include AlTiN. In general, the WF structure 714 can include any suitable work function materials and is not limited to AlTiN.

For purposes of clarity, the channels refer to a plurality of channels including the first to the fourth channels 22-25. The first structures refer to a plurality of first structures including the first structures 612 and 614. The WF structures refer to a plurality of WF structures including the WF structure 714. The second structures refer to a plurality of second structures including the second structures 812 and 814. The third structures refer to a plurality of third structures including the third structures 1312 and 1714.

FIGS. 5-21 show examples of schematic views of various intermediary steps of a manufacturing process according to some embodiments of the disclosure. In an example, the semiconductor apparatus 400 is fabricated by the manufacturing process. Referring to FIG. 5 when the manufacturing process starts, sources and drains of FETs in the semiconductor apparatus 400 are manufactured and metalized. The channels sandwiched between the gate low-k spacers 15, located on adjacent structures 18, are exposed. Residual FIN dielectric liner 510 can facilitate formation of the first to the fourth channels 22-25.

A first example is used to illustrate a manufacturing process. In the first example, the integration flow starts with opening of a replacement gate where there are upper pFET nanowires/nanosheets and lower nFET nanowires/nanosheets. In other embodiments, the nFET is placed over the pFET. The nanowires are open within the replacement gate and are sealed by a gate low-k spacer. Further beyond the gate low-k spacer is the upper and lower source and drains which are activated and metalized. The CFET device has power rails that have been positioned below the active device. For the example shown below, the perspective view shows two side-by-side standard cells. This illustrates how optimal placement of gate cuts can enhance the process by allowing the initial replacement gate trench to be essentially continuous that improves the capability of the disclosed methods, such as bottom-fill deposition and some of the selective deposition of dielectric films on conductor materials as well as the isotropic recessing of materials that are lowered to beneath a point of the upper suspended nanowires/nanosheets.

Referring to FIG. 5, in the first example, a CFET replacement gate is opened showing the floating upper and lower channel nanowires/nanosheets that are sealed at both ends of the opened replacement gate by the gate low-k spacer 15. The upper channel nanowires/nanosheets correspond to the second channel 24. The lower channel nanowires/nanosheets correspond to the first channel 22.

The manufacturing process is configured to form split gates based on the exposed channels and to further form the conductive traces and routing tracks. There are a few challenges to form split gates based on the channels shown in FIG. 5. Firstly, when a series of gate materials is formed over the previous gate materials or channels, the series of gate materials is also formed on dielectric materials, such as the gate low-k spacers 15, the interconnect caps or the buried power rail caps 14, the STIs 12, the residual FIN dielectric liner 510 embedded within the low-k spacer 15, and the like, resulting in shorting the split gates, such as the first gate 32 and the second gate 34. Secondly, trenches, such as the trenches 1330 and 1720(3) are formed in the third structures to separate adjacent gates, to stagger the split gates, and the like. In an example, the trenches can be deep. Thirdly, split gates, such as the first gate 32 and the second gate 34, are physically and electrically separated. According to some embodiments, the challenges described above can be addressed by implementing a series of selective depositions of gate materials over the previous gate materials or channels including selective deposition of high-k films directly onto silicon, SiGe, Ge channels. The high-k films can include HfO. The high-k films can include any high-k films used for established HKMG (high-k metal gate) devices. In an example, a gate oxide layer can be grown or deposited through the high-k film after the selective deposition of the high-k film directly on the silicon, SiGe, or Ge channels is completed. In addition, selectively depositing various work function and liner metals (such as materials used in the barrier layer of the first structures, the second structures, the WF structures) on other conductors and on high-k films without deposition onto dielectric materials such as the gate low-k spacer can also be used. In an example, films for gate-all-around metallization (such as materials used in the second structures) include but are not limited to TiN, TaN, TiAl, Ru, TiON, and the like.

In addition, one or more conductive materials having anisotropic etching property in the third structures can be used. Particularly, metallization of gates using metals that are relatively easy to anisotropically etch, such as ruthenium. A bottom-fill deposition of one or more conductive materials used in the third structure can be used. Particularly, a method of deposit gate metals described above through bottom-fill deposition methods can be used to simplify the full integration process. Anisotropic and selective etching process in forming trenches can be used. Another method includes selective deposition of dielectric materials over conductive materials of the lower gates. The dielectric materials or the dielectric separation layer can be used to physically separate the lower metalized gates from the upper metalized gates. Such dielectric materials can include, but are not be limited to, SiO, SiCO, SiCN, SiN, SiOCN, SiC, SiON, AlO, HfO, on metal surface such as Ru or other gate metals.

An example integration process is shown below. In this embodiment, a split gate structure is formed through direct anisotropic etching of the third structure of the gates, or the gate metal, such as Ruthenium. The lower gate can optionally be staggered with respect to the upper gate, as shown in FIG. 2A-2B, or as shown in FIG. 1A-1B and FIG. 4.

According to some embodiments, the series of selective depositions of gate materials can be used to prevent shorting the split gates. In the series of selective depositions of gate materials, a current gate material can be selectively deposited on a previous gate material or channels where a deposition rate on the previous gate material or channels is much larger than a deposition rate on the dielectric materials including the gate low-k spacer 15, the interconnect caps 14, the STIs 12, the residual FIN dielectric liner 510 embedded within the low-k spacer 15, and the like. In an example, a ratio of the deposition rate on the previous gate material over the deposition rate on the dielectric materials can be 10:1. In an embodiment, when a small amount of the current gate materials is deposited on the dielectric materials, the small amount of the current gate materials can be removed from the dielectric materials without affecting the current gate materials over the previous gate materials or channels, for example, by an etching process. Therefore, a selective deposition of the current gate materials can be followed by an etching process that removes the small amount of the current gate materials over the dielectric materials. Additionally or alternatively, the selective deposition can be done in a sequential manner in which multiple periods of selective depositions are followed by respective periods of etching processes in order to provide a selective deposition. In another example, the deposition rate on the dielectric materials can be minimal and set to zero, and thus, an etching process can be omitted.

The series of selective depositions of gate materials can include a first, a second, a third, and a fourth selective deposition. In the first selective deposition, the high-k layer is selectively deposited over the semiconductor materials forming the channels, such as Si, SiGe, and/or the like. In the second selective deposition, the barrier layer is selectively deposited over the high-k layer. In the third selective deposition, the WF structure is selectively deposited over the barrier layer. In the fourth selective deposition, the second structure is selectively deposited over the barrier layer or the WF structure. As described above, an etching process can follow the first, the second, the third, and the fourth selective deposition, respectively to remove a small amount of gate materials deposited over the dielectric materials. As described above, one or more of the series of selective depositions can be done in a sequential manner in which multiple periods of selective depositions are followed by respective periods of etching processes.

For example, the high-k layer can be selective to the channel material (e.g., either Si, SiGe, or Ge) and not to other dielectric materials within a replacement gate (such as low-k gate spacer 15, filled-in blocks within a gate, or dielectric caps such as the interconnect caps 14 overtop metalized contacts). In related replacement high-k layer metal gate processing, the high-k layer is deposited through ALD that not only deposits over the channel material (e.g, either Si, SiGe, or Ge) but along the surface of the gate low-k spacer 15 as well as any cut surfaces within the gate. Such non-selective deposition can cause shorting between the upper gate and lower gate of split gates because the high-k layer is to be selectively removed in the intended separation region between upper and lower gates without removing any material from the upper gate. The application of selective ALD herein addresses the issue by not depositing any high-k layer in the area between the intended gates.

In an example, selectively depositing other gate metals, such as liners and nFET and pFET work function metals (such as materials used in the barrier layer of the first structures, the second structures, the WF structures) on the high-k layer and other conductive or metal-containing materials is used. In an embodiment, because the high-k layer is only selectively deposited on the channel herein, all other gate metals will thus selectively deposit on the channel as well and not along the gate low-k spacer or any dielectric cuts already formed within the gate. Such a technique prevents shorting between upper and lower intended gates.

In an embodiment, to form trenches, such as the trenches 1330 and 1720(3), in the third structures, an etching process can be used to remove the one or more conductive materials of the third structures. According to some embodiments, the etching process can be anisotropic where a vertical etching rate along the first direction 10 in FIG. 4 is much larger than a horizontal etching rate within a plane perpendicular to the first direction 10. Therefore, one or more conductive materials having anisotropic etching property can be used in the third structures. According to some embodiments, transition metals, such as Ru, having an anisotropic etching property, can be used to form the third structures.

The etching process can also be selective where an etching rate of the one or more conductive materials is much larger than an etching rate of the dielectric materials and previous gate materials. The dielectric materials can include the gate low-k spacer 15, the interconnect caps 14, the dielectric separation layer 1410, and the like. The previous gate materials can include the first structures, the WF structures, and the second structures.

According to some embodiments, a bottom-fill deposition of one or more conductive materials used in the third structure can be implemented to simplify the manufacturing process to form split gates. In an embodiment, a bottom-fill deposition of one or more transition metals, such as Ru, can be used to form the third structures of the lower gates where the lower gates are filled with the one or more transition metals having minimal voids. In an example, the bottom-fill deposition can be implemented using chemical vapor deposition (CVD). Further, there is a relatively small amount of the one or more transition metals in the upper gates. Subsequently, an etching process can be used to remove the small amount of the one or more transition metals in the upper gates. In an example, the etching process can be an isotropic etching process, such as a CERTAS platform of etch equipment manufactured by Tokyo Electron Ltd.

According to some embodiments, the selective deposition of the dielectric separation layer 1410 over conductive materials of the lower gates can be used to physically and electrically separate split gates, such as the first gate 32 and the second gate 34. In the selective deposition of the dielectric separation layer 1410, a deposition rate on the conductive materials of the lower gates is much larger than a deposition rate on the previous gate materials and the dielectric materials. In an example, a ratio of the deposition rate on the conductive materials over the deposition rate on the previous gate materials and the dielectric materials can be 10:1. In another example, the deposition rate on the previous gate materials and the dielectric materials can be minimal and set to zero. In an embodiment, the small amount of the dielectric separation layer 1410 that is deposited on the previous gate materials and the dielectric materials can be removed without affecting the dielectric separation layer 1410 over the lower gates, for example, by an etching process. Therefore, a selective deposition of the dielectric separation layer 1410 can be followed by an etching process. Alternatively, a bottom-fill deposition of the dielectric separation layer 1410 can be used. In the bottom-fill deposition, for example, a bottom-up deposition of the dielectric separation layer 1410 such as SiO can be used to separate, for example, the gates 32 and 34, where a higher amount of the dielectric material, such as SiO is deposited over the gate 32 to form the dielectric separation layer 1410 as compared to the gate low-k spacers 15 and the second structure 814. Therefore, a selective isotropic etch can be used to remove the dielectric materials from the gate low-k spacers 15 and the second structure 814 with minimal effect on the dielectric separation layer 1410 between the gates 32 and 34.

In an embodiment, a method includes filling in a gate with a metal, for example, through CVD, bottom-fill CVD, PVD, or the like, that can be easily recessed with excellent selectivity to the final gate metal (such as the blocking layer of the third structures) that is part of the gate-all-around deposition, for example, TiN. Such processes can be executed when the gate filling metal is a transition metal such as Ru using the CERTAS etch platform developed by Tokyo Electron Ltd. The purpose of the etch-selective isotropic recess is to fill in the patterned upper and lower individual gates and then to recess the filling metal down below the upper gate before growing a dielectric film (or the dielectric separation layer 1410) which can separate the upper and lower gates from one another. In this respect, there is a significant benefit of selective deposition of the high-k, liner, and work function metals directly to the channel and not to the gate low-k spacer or any of the dielectric cuts already present in the gate structure. Without selective deposition, the metals (liner, and work function metals that do not etch in the isotropic recess process) can still remain and cause shorting between the formed upper and lower gates. An alternative method herein is a bottom-fill CVD deposition of a transition metal such as Ru that can fill the lower gate entirely and the upper gate partially. A vapor-phase etch process (e.g. using CERTAS) providing isotropic etch is then used to clean off the transition metal fill or Ru from the intended upper gate regions.

In an example, a dielectric film such as the dielectric separation layer 1410 can be selectively deposited directly on a conductive surface such as that of the transition metal such as Ru. When transition metal such as Ru is recessed down to define the lower gate, a dielectric film is then deposited onto the surface of the transition metal such as Ru and not along the final gate metal such as TiN that is on the upper gate. The dielectric film is also not deposited on other dielectric surfaces such as the low-k gate spacer or dielectric filled cuts within a metal gate.

In an example, to form a dielectric barrier or the dielectric separation layer 1410 between the upper and lower gates a bottom-fill deposition of dielectric barrier or a quasi-selective deposition process can be implemented where the bottom of the recessed metal gate can have a higher amount deposition of the dielectric barrier compared to sidewalls or along the upper gate. Subsequently, a selective isotropic etch can be used to remove the dielectric barrier from the sidewalls or along the upper gate while preserving the amount of the dielectric barrier at the bottom of the recessed gate.

In an embodiment, the manufacturing process can fabricate the first structures of the split gates simultaneously. Similarly, the second structures, and the third structures of the split gates can be fabricated simultaneously. The WF structures are fabricated over the upper gates. For purposes of clarity, the description is given for the first gate 32 except for describing the WF structures.

Figure 6:
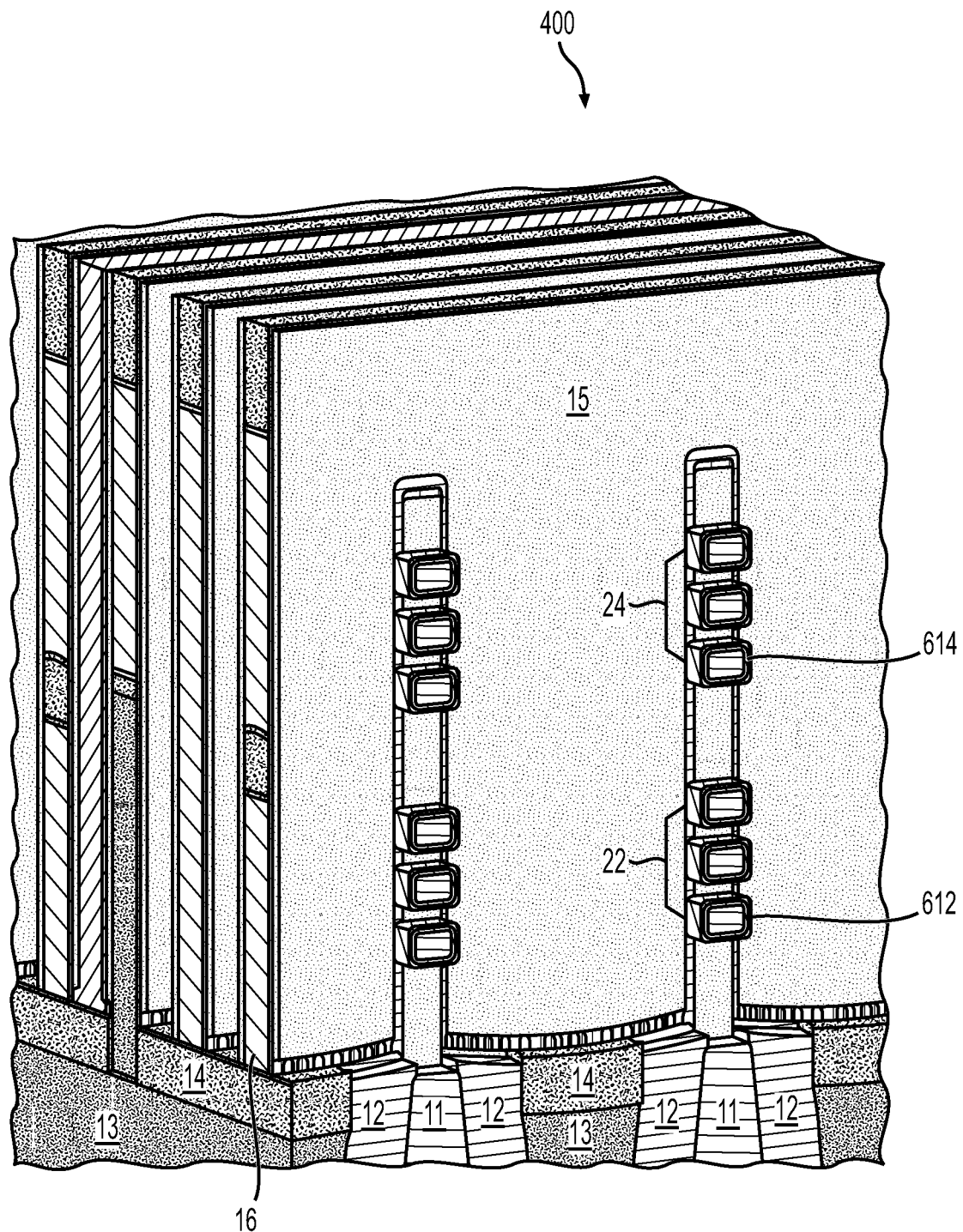

Referring to FIG. 6, the first structures, such as the first structures 612 and 614, can be formed over the channels, such as the first channel 22 and second channel 24, respectively. The first structures include the high-k layer and the barrier layer. The high-k layer can include any suitable material system and structure. In an example, the high-k layer can include dielectric material having a high dielectric constant, for example, greater than that of silicon oxide (3.9). In an example, the high-k layer can be HfO.

As described above, the first selective deposition is used to form the high-k layer. In the first selection deposition, the high-k layer is selectively deposited over semiconductor materials, such as Si, Ge, SiGe, and the like. In an example, the first selective deposition can be implemented using a selective atomic layer deposition (ALD) on the semiconductor materials. Using the first selective deposition, the high-k layer is deposited over the channels and the substrate strips 11. In an example, when a small amount of high-k layer is deposited over the dielectric materials including the gate low-k spacer 15, the small amount of high-k layer can be removed from the dielectric materials without affecting the high-k layer over the semiconductor materials using, for example, an etching process.

In an embodiment, an interfacial layer, such as $SiO_2$, can further be formed between the channels and the high-k layer. The interfacial layer can include a dielectric material such as $SiO_2$, HfSiO, SiON, and the like. The interfacial layer can be formed by chemical oxidation, thermal oxidation, ALD, CVD, and the like. In an example, a gate oxide layer can be grown or deposited through the high-k film after the selective deposition of the high-k film directly on the silicon, SiGe, or Ge channels is completed.

In the second selective deposition, the barrier layer can be selectively deposited over the high-k layer. The barrier layer can include any material system and structure to prevent diffusion between the high-k layer and the WF layer. In an example, the barrier layer can include TiN. Similarly, a small amount of barrier layer over the dielectric materials can be removed without affecting the barrier layer over the semiconductor materials.

Referring to FIG. 6, in the first example, selective deposition of a high-k layer such as HfO directly onto the nFET and pFET channels (in an example, a nFET channel includes Si and a pFET channel includes SiGe) and not on the dielectric materials such as the gate low-k spacers 15, exposed cap materials over source/drain region, the STIs 12, the interconnect caps 14 over the buried power rails 13, and the like. After selective deposition of the high-k layer, the first TiN layer is then selectively deposited over the high-k layer and not on the dielectric materials. Conventional ALD can be used for gate-all-around metallization. High-k and TiN layers can be deposited along surfaces of the gate low-k spacers 15 as well as along the channels. The presence of metal along the gate low-k spacers 15 can lead to shorting between the individual pFET and nFET gates down-stream in the integration. Accordingly, using selective deposition capability to deposit the high-k layer directly on Si, SiGe, or Ge channels is beneficial as well as the ability to deposit gate metals directly on top of other gate metals.

Figure 7:
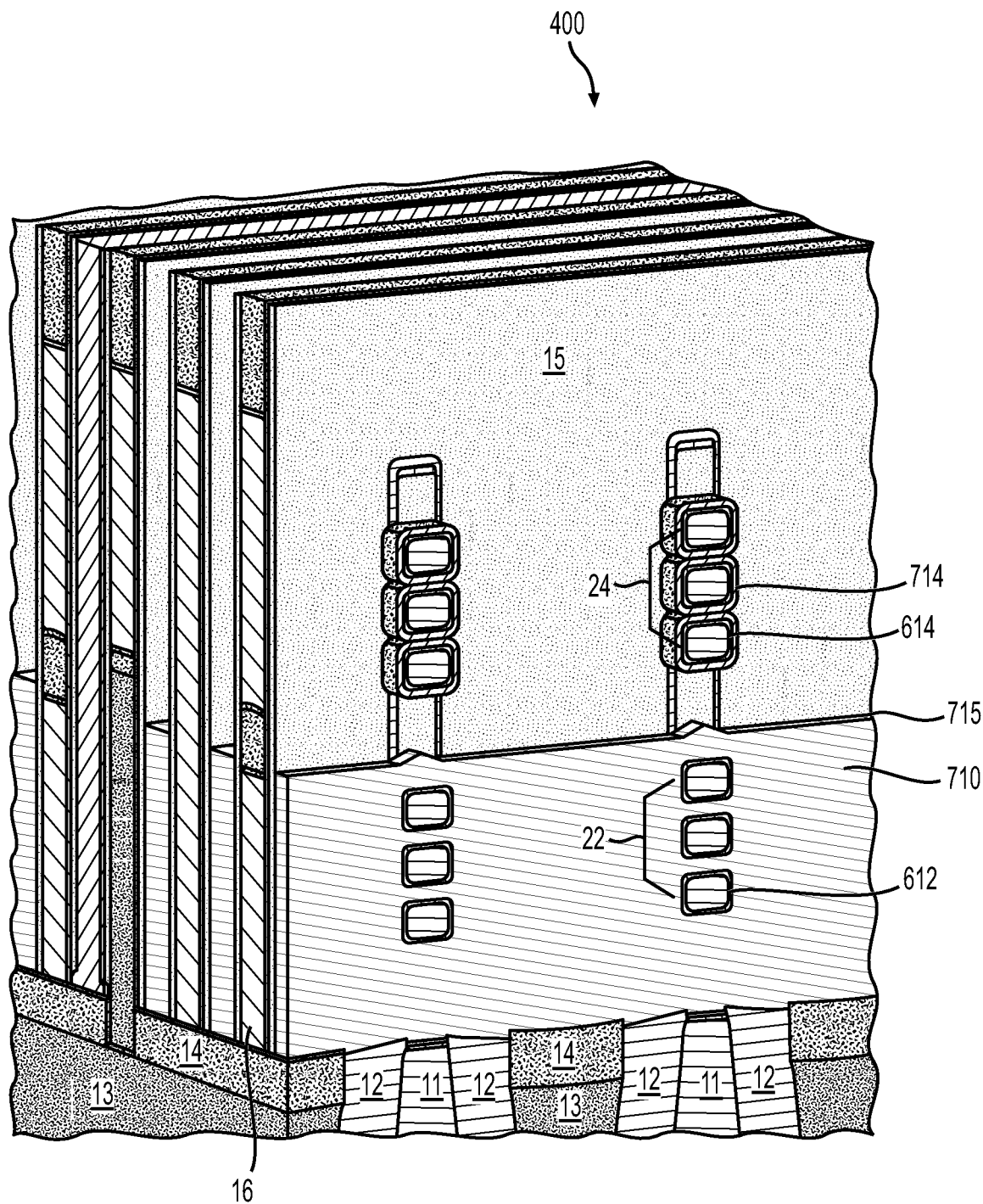

Referring to FIG. 7, after forming the first structures, the WF structure 714 can be formed over the channels of the upper gates, such as the second channel 24. According to some embodiments, in order not to deposit the WF structure 714 on the channels of the lower gates, the channels of the lower gates can be blocked using, for example, a non-conductive fill material 710 recessed to a first recess level 715 between the first channel 22 and the second channel 24. In an example, the non-conductive fill material 710 is spin-on carbon (SoC). The WF structure 714 can be selectively deposited over the barrier layer using the third selective deposition. The WF structure 714 can adjust the work-function of the upper gates. In an example, the WF structure 714 includes TaN followed by TiN. In an example, the third selective deposition can be implemented using a selective ALD. Similarly, a small amount of WF structures over the dielectric materials can be removed without affecting the WF structures over the first structures.

Referring to FIG. 7, in the first example, blocking of a lower nFET gate with non-conductive fill material such as SoC and recessed down to a certain height, such as the first recess level 715, of lower channel followed by selective deposition of pFET gate metals (TaN/TiN) onto the exposed TiN already on the pFET channel can be implemented.

Figure 8:
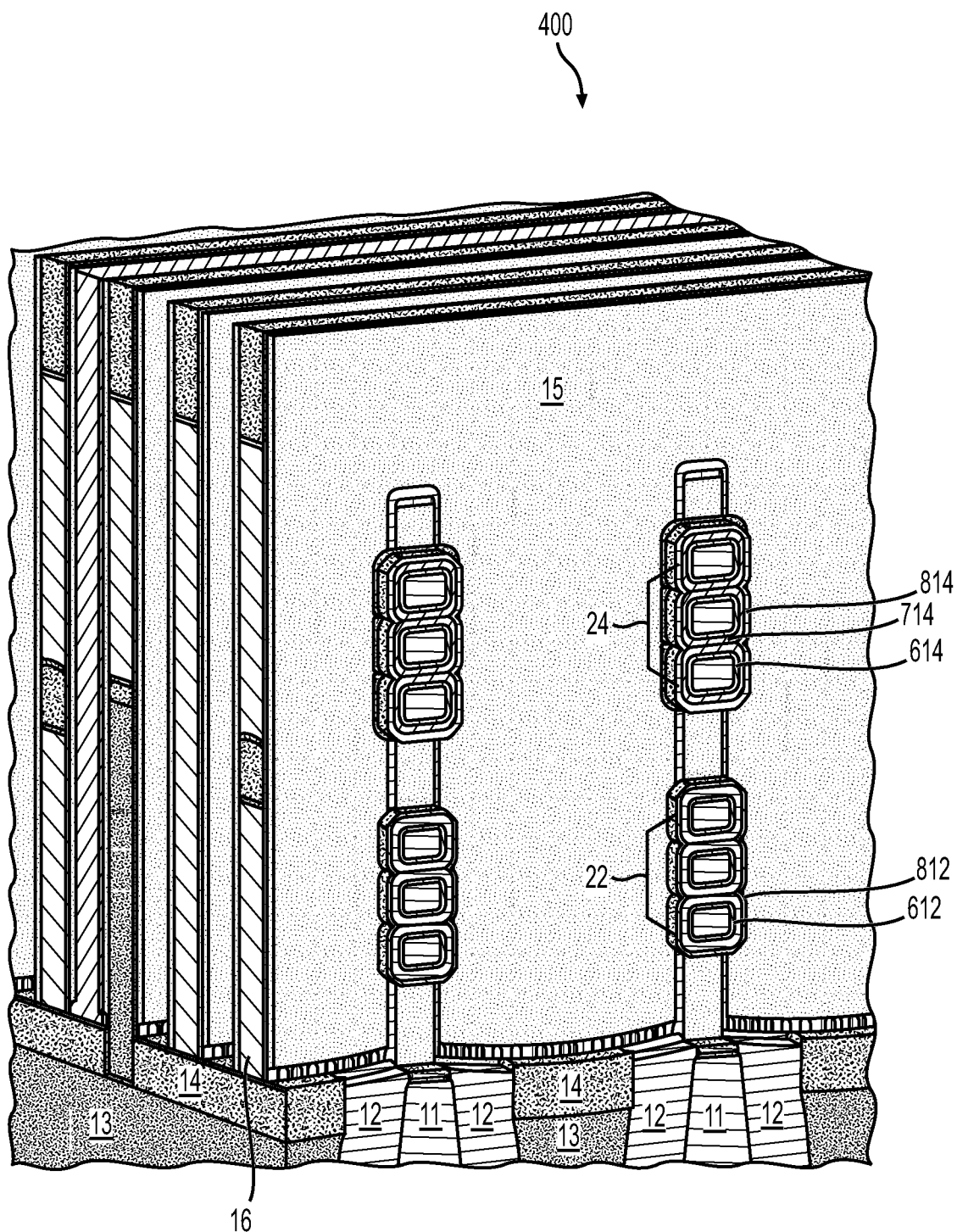

Referring to FIG. 8, the non-conductive fill material 710 is removed. Subsequently, the second structures can be selectively deposited over the first structures of the lower gates, and the second structures can be selectively deposited over the WF adjustment structures of the upper gates. For example, the second structures 812 and 814 include the WF layer, such as AlTiC and AlTiO, and the blocking layer, such as TiN. Similarly, a small amount of the second structures over the dielectric materials can be removed without affecting the second structures over the first structures or the WF structures.

Referring to FIG. 8, in the first example, removal of a lower gate blocking film and then selective deposition of work-function and final TiN layers selective to the metal films already deposited along the channel, but not on any dielectric materials within the opened replacement gate, can be implemented.

Due to the series of selection depositions, the first structures, the WF structures, and the second structures are formed over the channels, and are not formed over the dielectric materials, thus, preventing shorting the split gates. As described above, one or more etching processes can be used in one or more of the first, the second, the third, and the fourth selective depositions, respectively to remove a small amount of gate materials deposited over the dielectric materials.

In an embodiment, there are several options of how the upper pFET gate metals are treated. Because the downstream integration, in some embodiments, metalizes the lower gate to be metalized with transition metals including Ru before selectively depositing a dielectric layer (or dielectric separation layer 1410) to isolate the lower gate from the upper gate, a manner of selective deposition of the dielectric layer can be identified. For an embodiment of a dielectric material that grows equally on transition metal as well as on the TiN of the upper gate, suitable process steps can be executed. The non-conductive fill is again deposited into the gate and recessed down to the lower gate level. A particular type of dielectric material is selectively grown on the surface of the TiN on the upper gate. Subsequently, the non-conductive filling material is removed from the bottom gate.

In an embodiment, the dielectric material on the upper gate metals can be selected to provide a certain film difference in order that a dielectric material is grown selectively on the transition metal fill, but not on the TiN of the upper gate. The dielectric material deposited can be removed by, for example, vapor-phase etch or through atomic-layer etching before the upper gate is metalized. For selective deposition of dielectric materials on metal, the deposition amount on the transition metal surface can be adjusted to be significantly more than the dielectric material initially deposited on the TiN surface so that when a simple atomic layer etch is done, there will be an adequate amount of dielectric material separating the upper gate from the lower gate.

In general, for more complex standard cell designs, a combination of splits gates as well as common gates, dummy gates, and single diffusion breaks can be used. Common gate formation can be enhanced by being executed independent of the split gates. Additionally, formation of a single diffusion break for nanowire/nano-sheet process is described in U.S. Pat. No. 9,721,793, titled "Method of patterning without dummy gates", the entirety of which is incorporated herein by reference. In some embodiments, an intended diffusion break is opened in the replacement gate process, and the nanowires/nanosheets anisotropically is removed and the gate effective is sealed by placing a dielectric film inside. Floating nanowires or nano-sheets may be preserved as "studs" still embedded in the gate low-k spacer so that there is minimal disruption to the source and drain, which has been grown in the contact area and the metallization of the contact adjacent to the diffusion break is also undisturbed, leading to consistent strain profile along the channel for the active areas.

In an embodiment, the choice of Ru for the lower and upper gates allows for direct anisotropic etch which is not common to other gate metals. Thus, the choice of Ru for the metal gate fills enables the split gate configuration. The direct etched patterning into the Ru can be simple cuts to define gate separations, or the cuts can be more extensive in order to provide a staggered pattern for the lower gate relative to the upper gate. In embodiments used in the first example, simple gate cuts are shown that can isolate the lower gates in adjacent cells.

Figure 9:
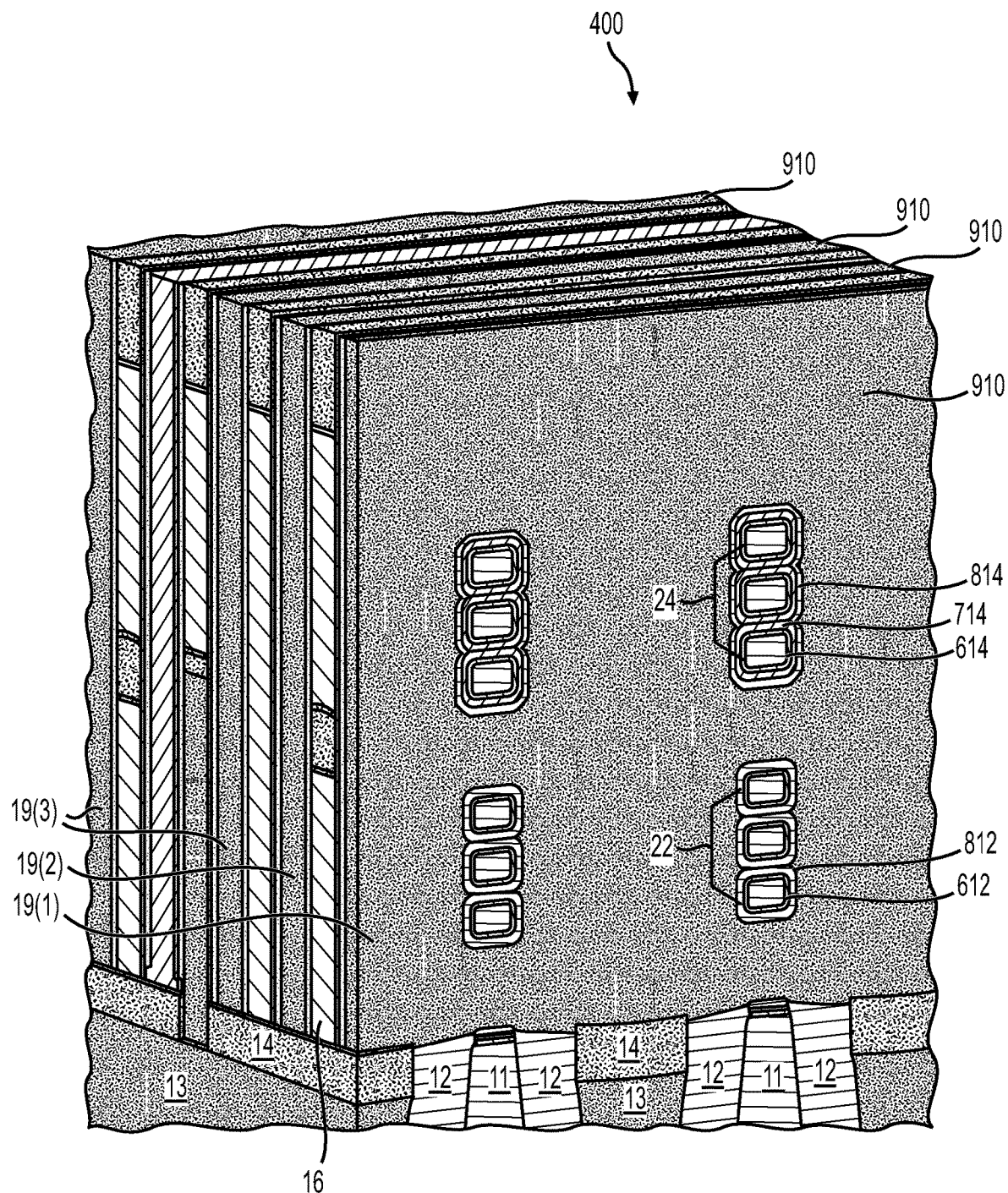
Figure 10:
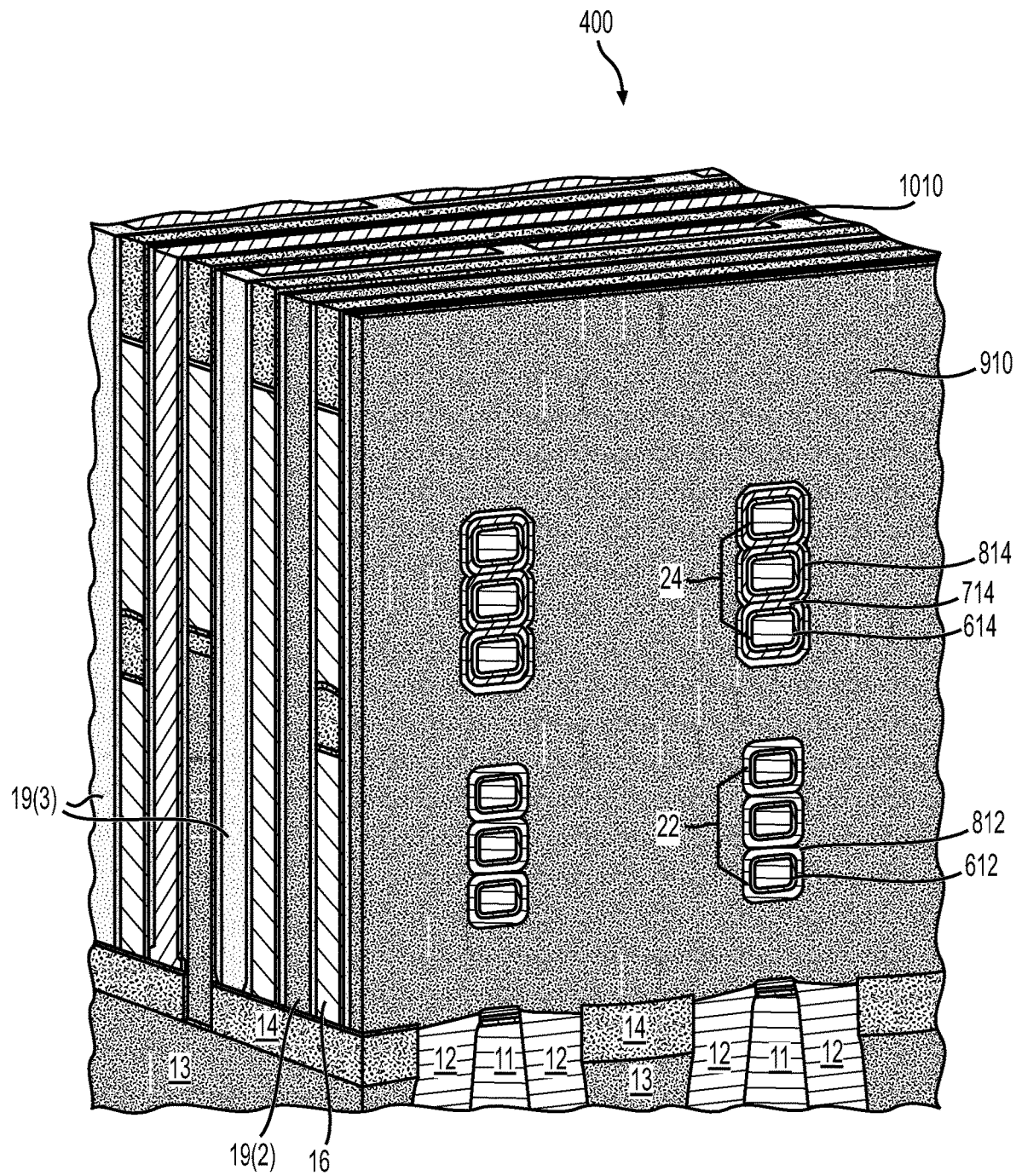

FIGS. 9-10 show steps related to forming the common gates. In an embodiment, the third structures of the common gates and the third structures of the split gates can include different materials. In another embodiment, the third structures of the common gates and the split gates can include the same materials. In the present disclosure, the third structures of the common gates and the split gates including the same materials is used as an example, however, the disclosure can be suitably modified to apply to the third structures of the common gates and the split gates including different materials.

Referring to FIG. 9, one or more conductive materials 910 of the third structures are deposited within the regions 19(1)-(3). As described above, transition metals, such as Ru, having an anisotropic etching property, can be used to form the third structures. Referring to FIG. 10, the third structures of the common gates are formed within the regions 19(3), followed by covering the third structures of the common gates with common gate caps 1010. The common gate caps 1010 can include any suitable dielectric materials and structure that can isolate the common gates. In an example, the common gate caps 1010 include SiN.

Referring to FIGS. 9-10, in the first example, the one or more conductive materials 910 correspond to gate metal fill using transition metal such as Ru. Following processing of the common gates (not shown), the top of the common gates is recessed and capped with the common gate caps 1010 such as SiN.

Figure 11:
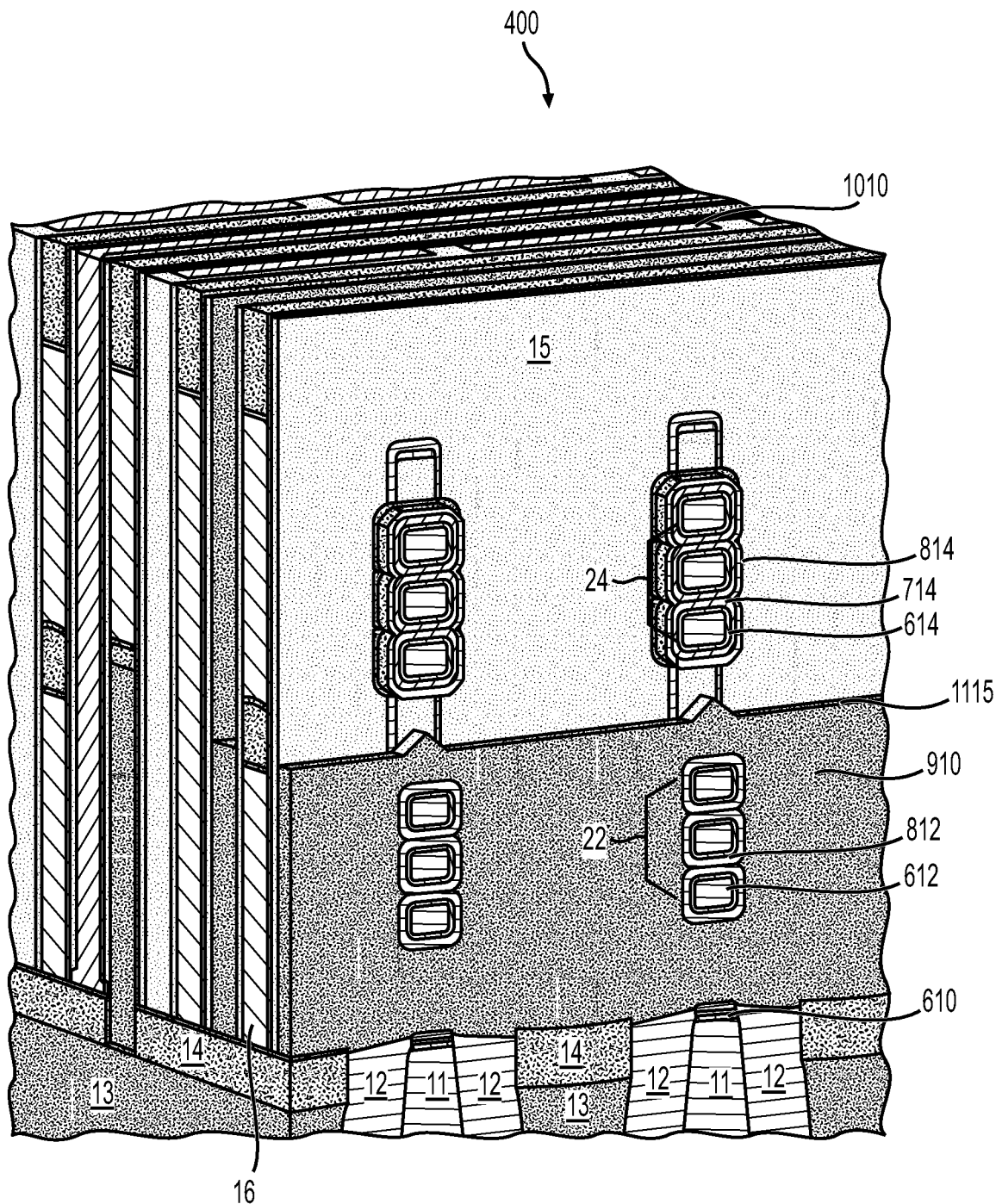
Figure 12:
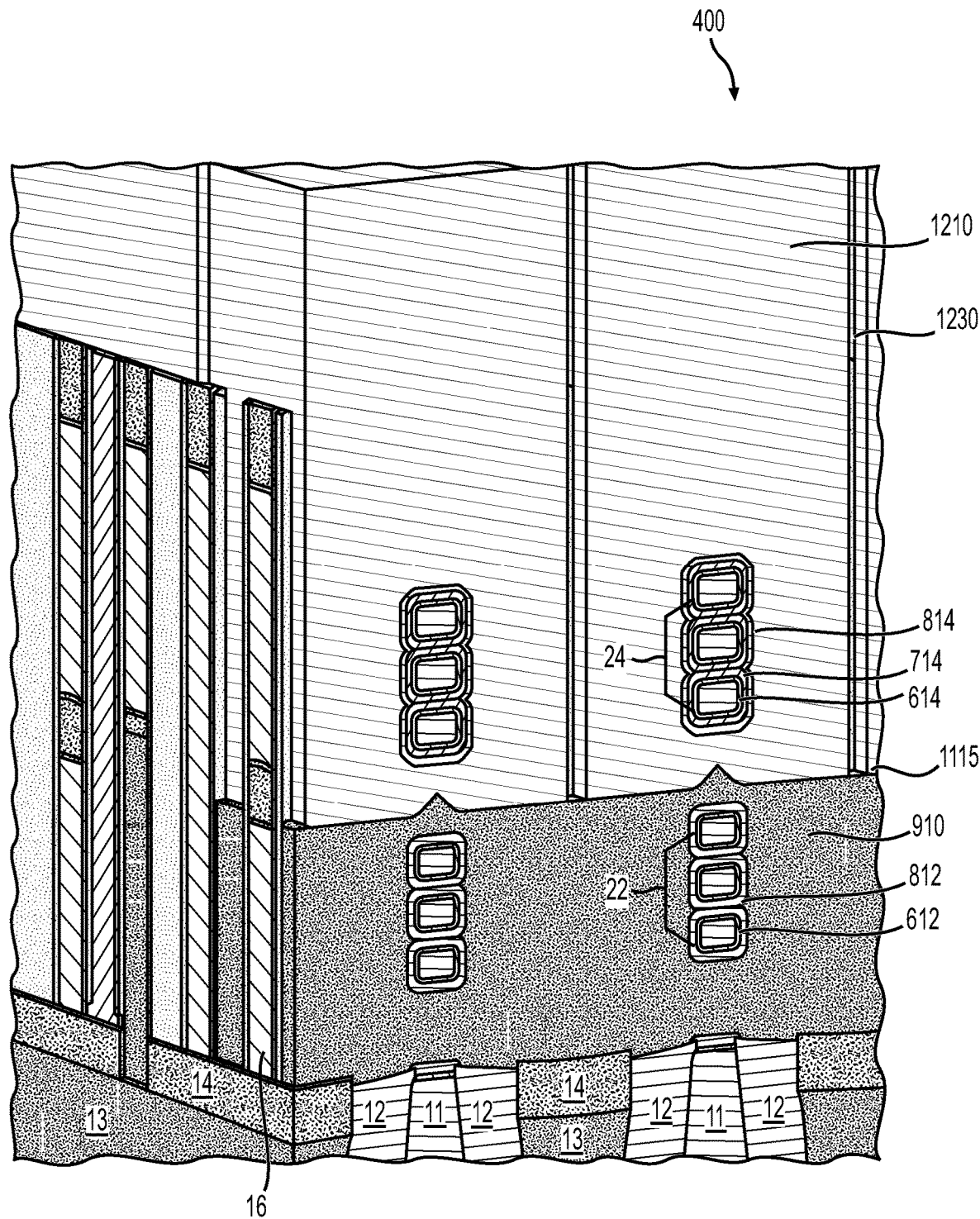
Figure 13:
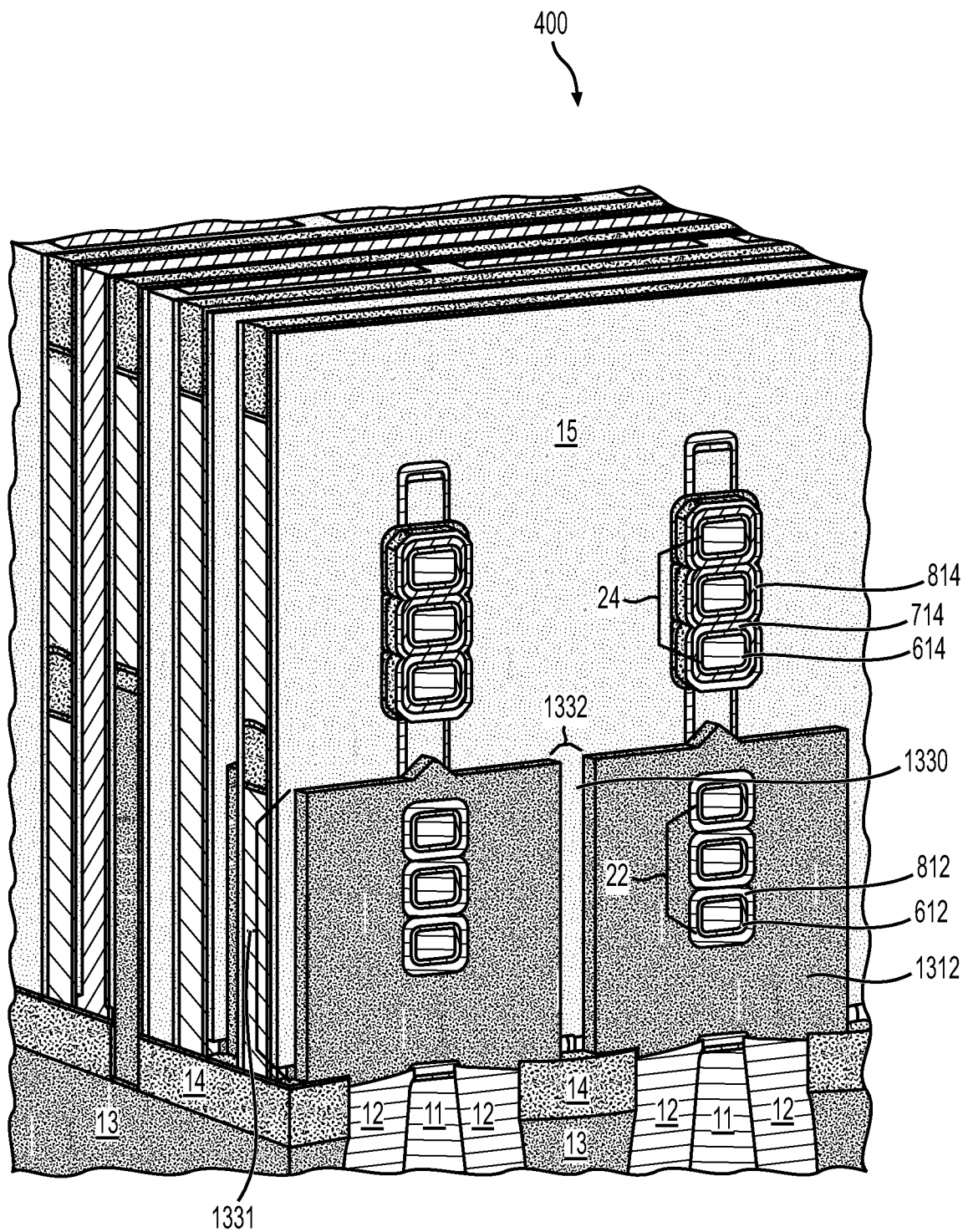

FIGS. 11-13 show steps of forming the third structures of the lower gates, such as the third structure 1312 of the first gate. Referring to FIG. 11, the one or more suitable conductive materials 910 can be recessed to a second recess level 1115. In an example, the second recess level 1115 and the first recess level 715 are identical. As described above, the selective etching process can be used in order not to etch the dielectric materials including the gate low-k spacer 15 and other gate structures including the second structures, thus, preserving properties, such as the work-function, of the upper gates. In an embodiment, the selective etching process can be selective plasma etching implemented using, for example, a Certas equipment manufactured by Tokyo Electron Ltd.

Referring to FIG. 11, in the first example, the Ru gate metal is isotropically recessed with high selectivity to the pFET gate metals and the low-k gate spacer 15 using a vapor-phase etch process. In an example, chemistry used in the vapor-phase etch process is selected not to etch the pFET gate metals, the gate metals wrapping around the channel, work function materials/structures, and the like.

Referring to FIG. 12, one or more patterning materials 1210, such as SoC, are formed on top of the semiconductor apparatus 400. Patterns 1230 are then generated. Referring to FIG. 12, in the first example, the upper replacement gate is filled with a patterning film corresponding to the one or more patterning materials 1210 where gate cuts intended for the bottom gate are patterned.

FIG. 13 illustrates an embodiment where the patterns 1230 are transferred to form the third structures of the lower gates including the third structure 1312 of the first gate 32. In an example, the trench 1330 can have a large aspect ratio of a depth 1331 over a width 1332. As described above, the anisotropic etching process can be used to form the trench 1330, thus separating adjacent gates, such as the first gate 32 and the third gate 33 of different standard cells. Further, the etching process is also selective in order not to etch the dielectric materials including the gate low-k spacer 15, as described above. In an embodiment, the selective etching process can be selective plasma etching implemented using, for example, a CERTAS etching equipment platform manufactured by Tokyo Electron Ltd. After the etching process, the lower gates are formed. Referring to FIG. 13, in the first example, the patterned gate cuts are then transferred directly into the lower gates.

Figure 14:
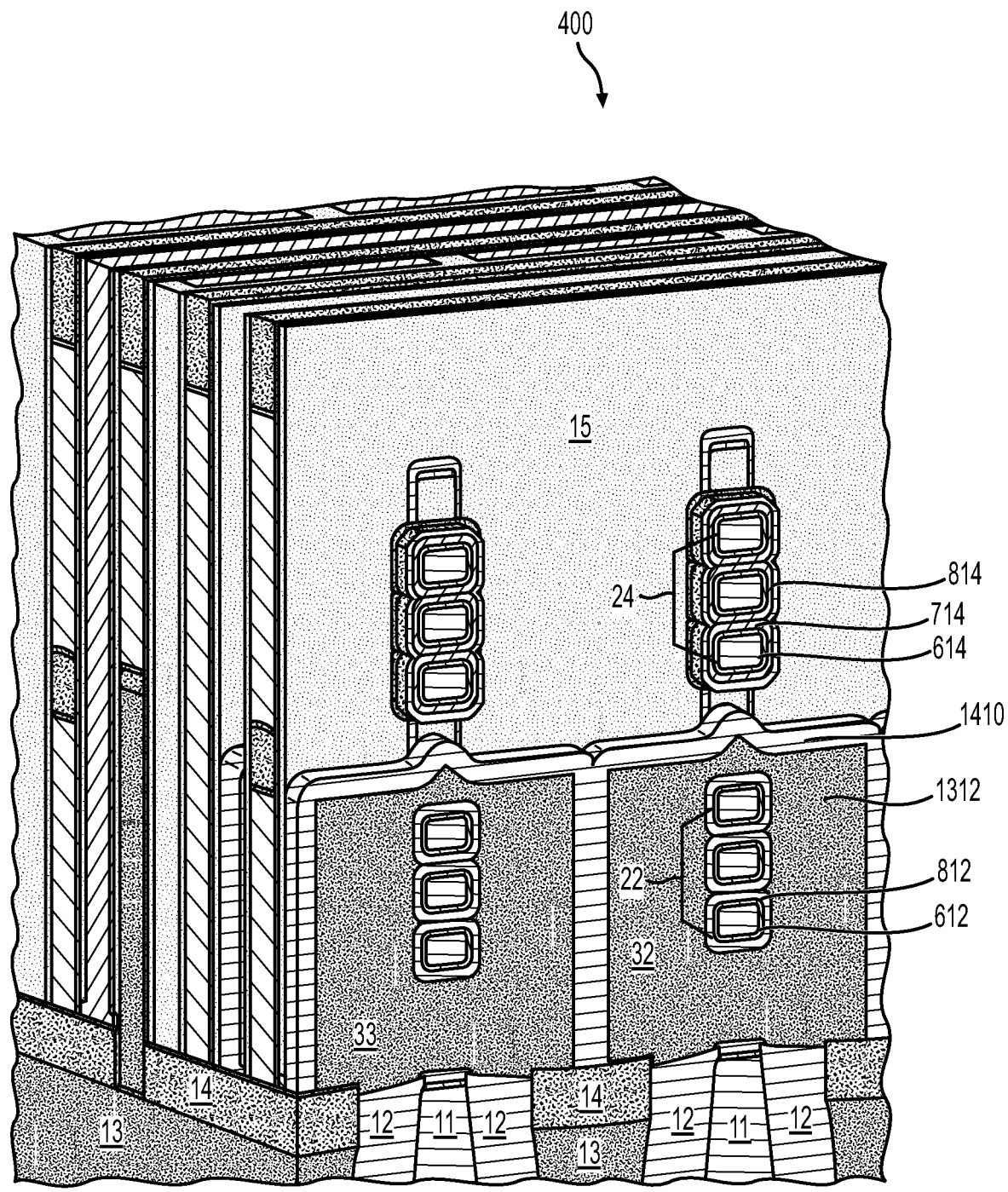

Referring to FIG. 14, the dielectric separation layer 1410 including one or more dielectric materials can be formed to physically and electrically separate split gates, such as the first gate 32 and the second gate 34. As described above, the selective deposition of the dielectric separation layer 1410 over conductive materials of the lower gates can be used. In an example, the conductive materials can include a transition metal such as Ru. Further, the one or more dielectric materials can also be formed in the trenches (e.g., the trench 1330 in FIG. 13) between adjacent lower gates, such as the first gate 32 and the third gate 33. In an example, a width of the trenches, such as the width 1332 of the trench 1330, can depend on one or more dielectric constants of the one or more dielectric materials used to fill the trenches. For example, when the one or more dielectric constants is close to that of a low-k spacer material such as SiOC (k=4.0) or SiO (k=4.0), the width of the trenches can be as small as 5 nm. In an example, the width 1332 of the trench 1330 between the adjacent gates 32 and 33 can be equal to a separation between the routing tracks 2220(5) and 2220(6). The separation between the routing tracks 2220(5) and 2220(6) can be ½ of a critical metal pitch, for example, between 10 and 16 nm.

Referring to FIG. 14, in the first example, dielectric material corresponding to the dielectric separation layer 1410 is selectively deposited overtop the recessed and patterned Ru in the lower gates. The TiN on the pFET wrap-around gate can be deposited with a dielectric in order to have the selective deposition on the interface of Ru. Selective deposition of dielectric on metal also exhibits certain conformity within the upper replacement gate, but the deposition at the bottom of the opened trench is much higher than along the sidewall of the trench, and thus, an isotropic dielectric etch may be subsequently executed to keep the dielectric at the exposed surfaces of Ru.

Figure 15:
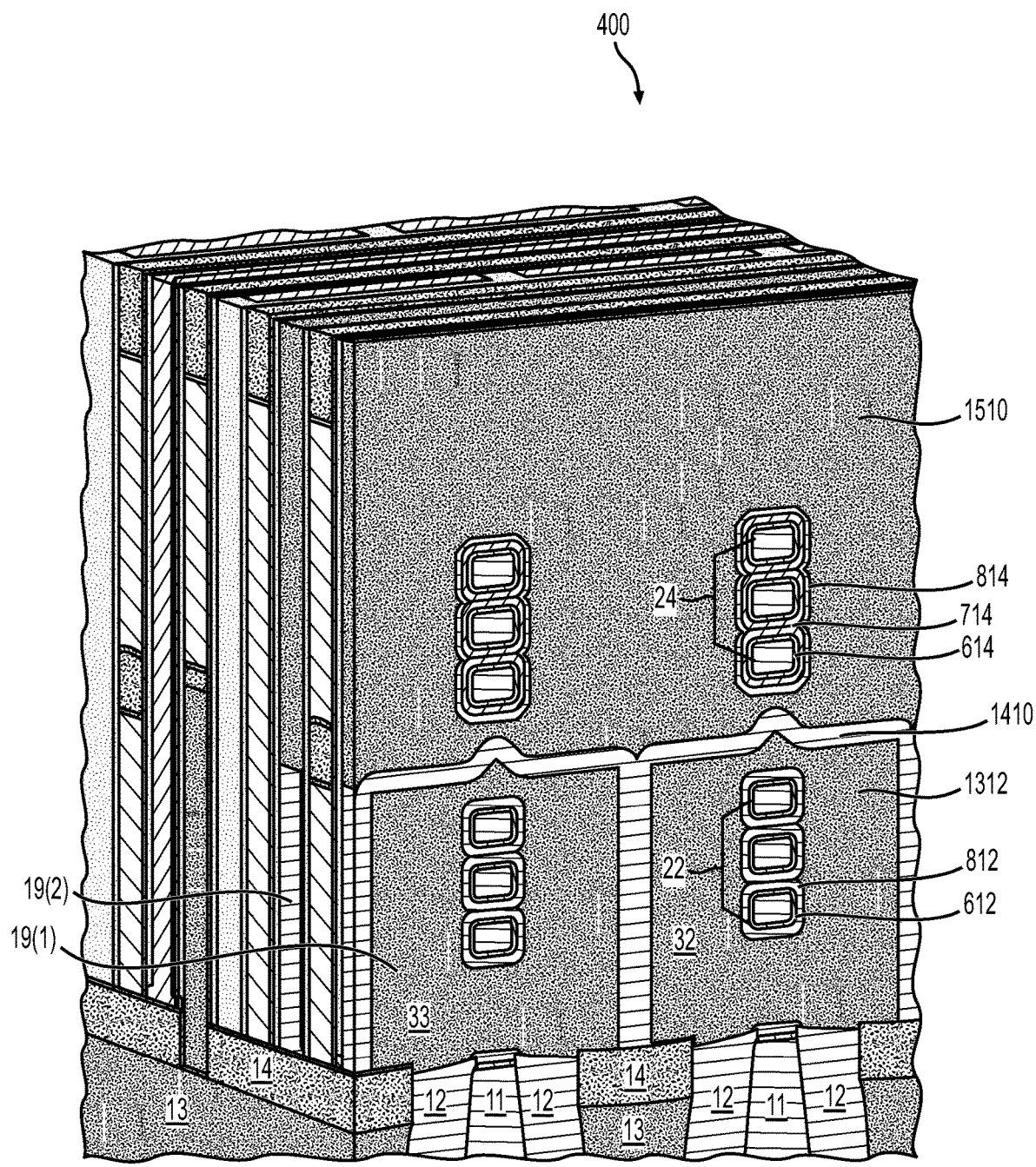
Figure 16:
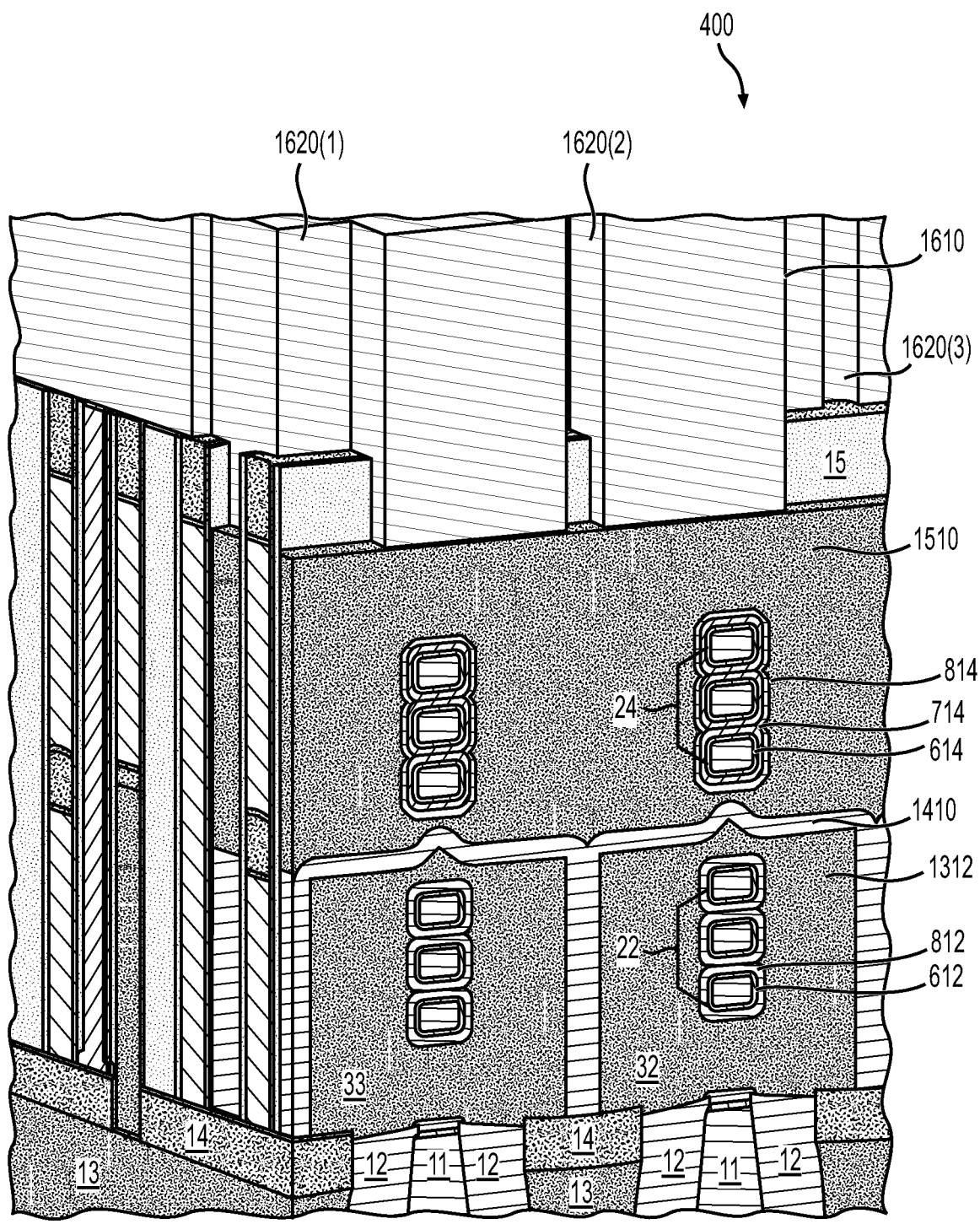
Figure 17:
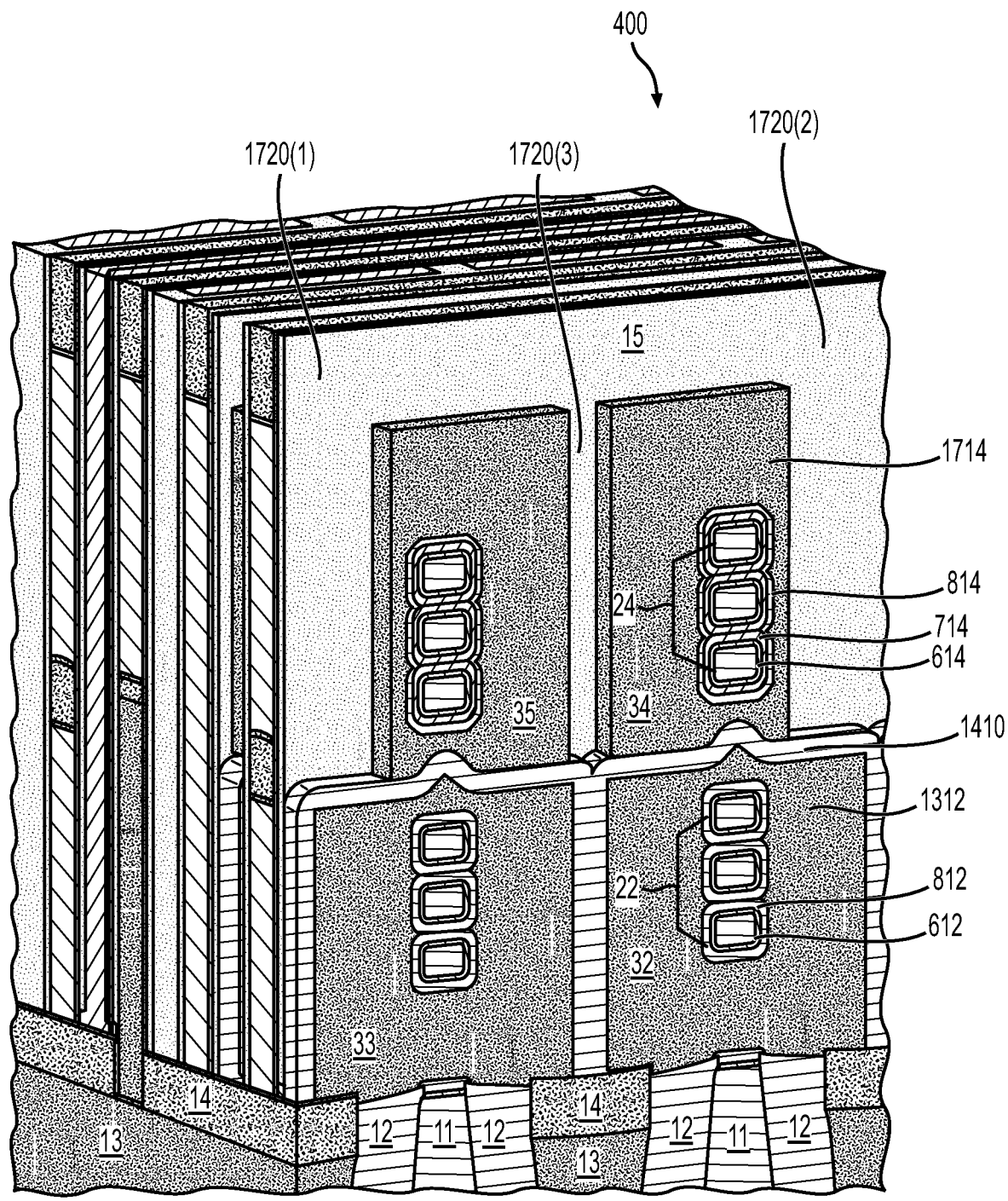

FIGS. 15-17 show an embodiment of steps of forming the third structures of the upper gates, such as the third structure 1714 of the third gate 34. Similarly, one or more conductive materials having anisotropic etching property can be used. In an example, transition metals, such as Ru, can be used. Referring to FIG. 15, the one or more conductive materials, such as transition metals 1510 including Ru, can be deposited within the regions 19(1)-(2) on top of the dielectric separation layer 1410. Referring to FIG. 15, in the first example, upper gates are metalized with Ru or other transition metal that can be directly etched anisotropically.

Referring to FIG. 16, a patterning film 1610, such as SoC, can be formed on top of the semiconductor apparatus 400. Patterns 1620(1)-(3) can be formed. Referring to FIG. 16, in the first example, upper gates patterning includes gate cuts as well as the staggering pattern that enables direct connection to be formed from the lower gates to the respective routing tracks.

Referring to FIG. 17, the patterns 1620(1)-(3) are transferred to form trenches 1720(1)-(3). As described above, the one or more conductive materials 1510 can be etched by an anisotropic and selective etching process to form the trenches 1720(1)-(3). As a result, the third structures of the upper gates, such as the third structure 1714 of the second gate 34, are formed, and thus, the split gates 32 and 34 and the split gates 33 and 35 are formed, respectively.

Referring to FIG. 17, in the first example, the upper gate patterning is transferred to the upper gate Ru metal. Direct anisotropic etching of Ru can enable the staggering or stair-casing of the upper and lower gates with respect to one another. In the first example, a lower gate can have access to up to a minimum of two routing tracks depending on how the upper gate is patterned (left-hand or right-hand orientation with respect to the lower gate). An upper gate in the first example can have access to up to three routing tracks.

Referring to FIGS. 8 and 17, in general, the first structures 612 and 614, the WF structure 714, and the second structures 812 and 814 have a relatively lower conductance than that of the third structures 1312 and 1714, and are referred to as low conductance structures of the gates 32 and 34. The low conductance structures can be formed around the first and second channels 22 and 24, respectively, and not on sidewalls of the gates 32 and 34 because the low conductance structures can be formed by the series of selective depositions. Further, the third structures 1312 and 1714 having a high conductance are formed around the first and second channels 22 and 24 and on the sidewalls of the gates 32 and 34, thus, improving conductance of the gates 32 and 34, respectively.

Figure 18:
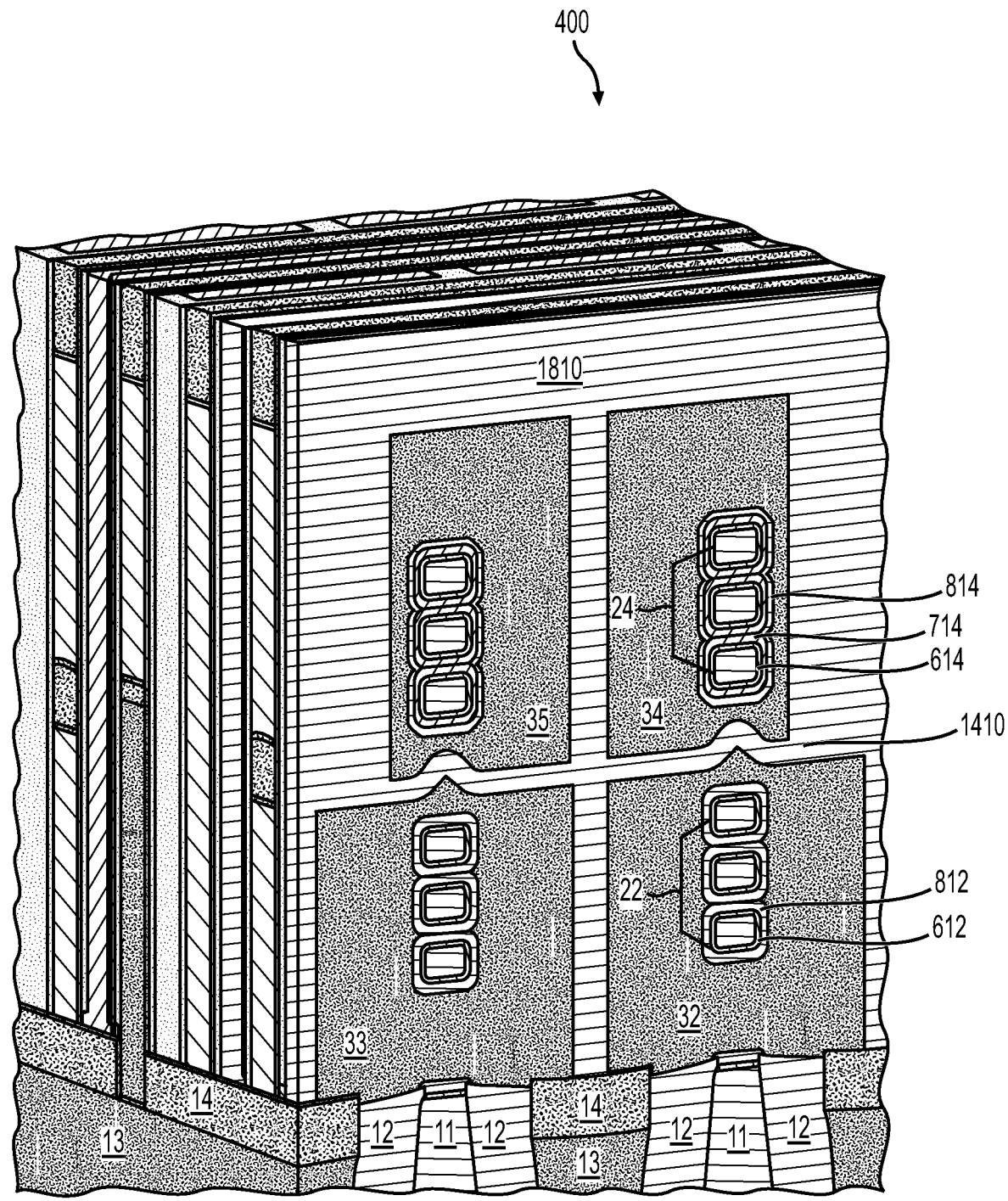
Figure 19:
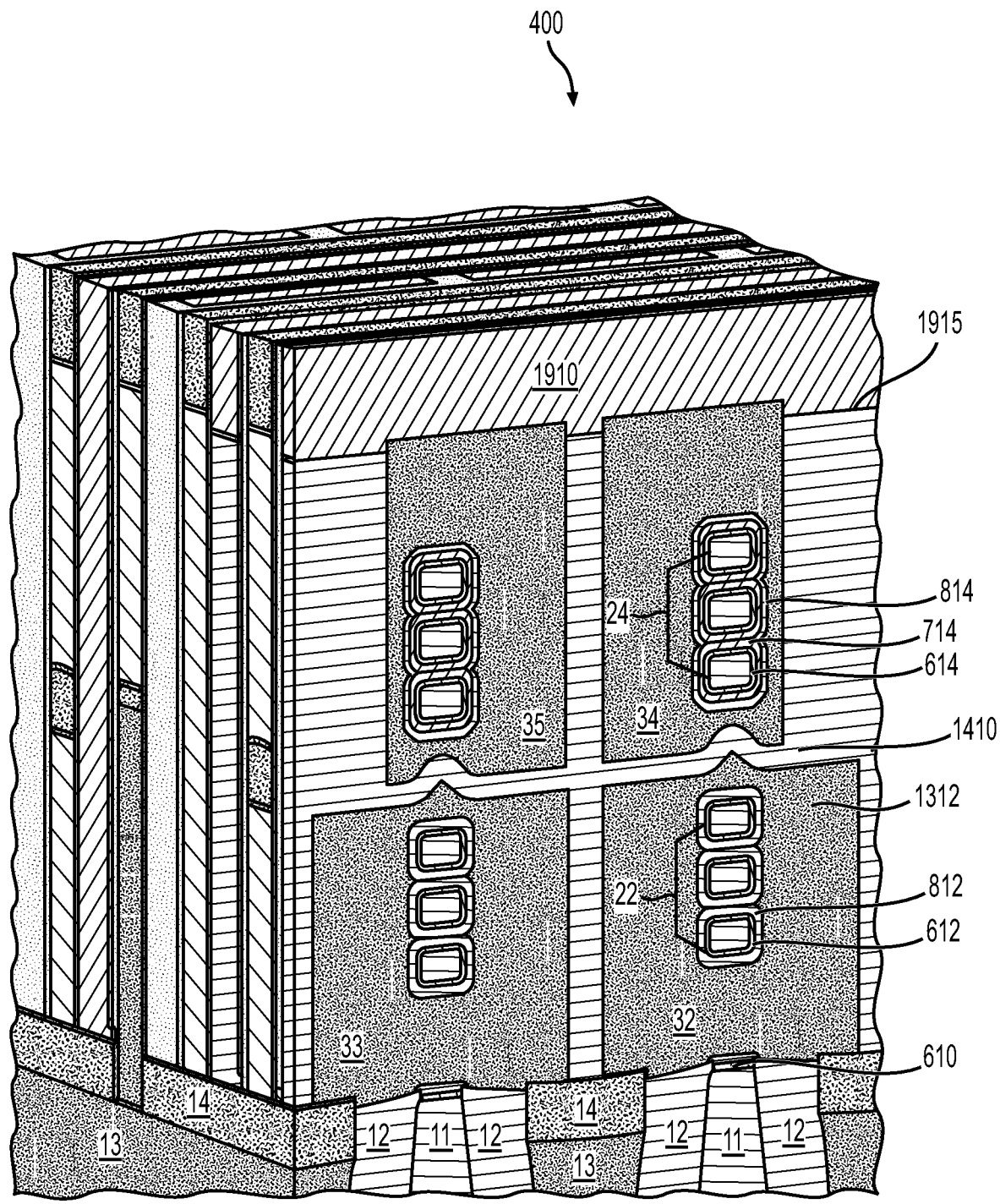

FIGS. 18-21 and FIG. 4 show an embodiment of steps to form separate conductive traces for the split gates, and to connect the separating conductive traces to respective routing tracks. Referring to FIG. 18, a dielectric material 1810 is used to fill gaps between the FETs. Referring to FIG. 18, in the first example, dielectric material corresponding to the dielectric material 1810 is used to fill between the metal gates. FIG. 19 shows that the dielectric material 1810 is recessed to a third recess level 1915. In an example, the third recess level 1915 is within the upper gates and is above the channels of the upper gates. Subsequently, a gate cap 1910 is formed above the upper gates, for example, to provide self-alignment when forming the conductive traces. In an example, the gate cap 1910 can be SiN where an etch rate of SiN can be significantly different from an etch rate of the low-k gate spacer 15, the interconnect caps 14, and the like. Referring to FIG. 19, in the first example, the dielectric fill within the metal gate is recessed and a common gate cap is placed within standard cells. The common gate cap can provide self-alignment for the placement of via-to-gate and via-to-source/drain. In an example, to simplify the self-alignment technique, a single gate cap material (such as SiN) can be used that has etch selectivity to the gate low-k spacers 15 and to caps placed over metal contacts (such as SiO/SiC/SiCO/SiCN).

Figure 20:
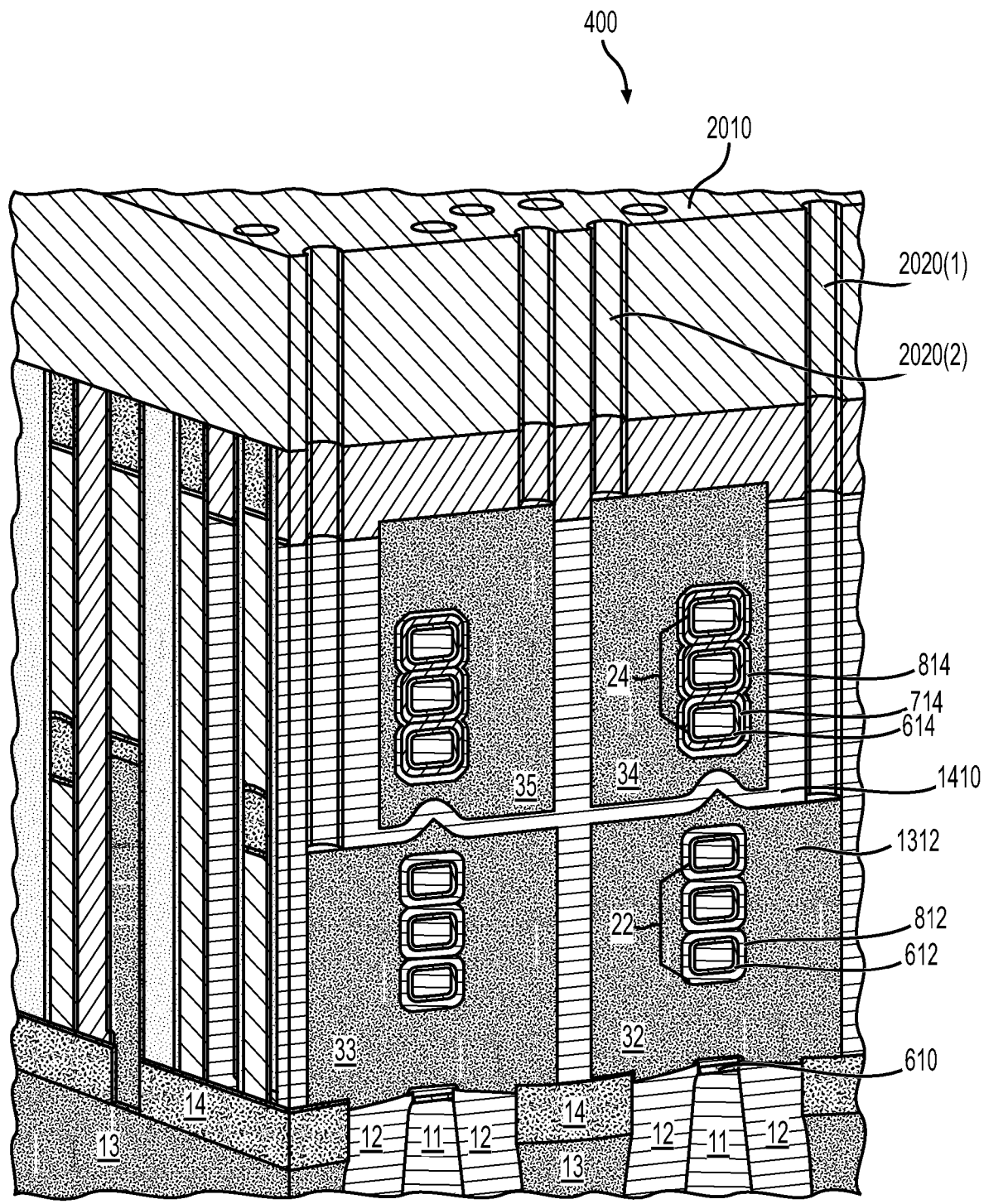

FIG. 20 shows an example where patterning material 2010 is formed over the gate cap 1910. Further, channels 2020(1)-(2) connecting the patterning material 2010 to the lower gates and the upper gates are formed. In an example, a selective etching process can be used to form the channels 2020(1)-(2). Referring to FIG. 20, in the first example, via-to-upper gate and via-to-lower gate patterning and transfer through the gate dielectric selective to the gate low-k spacer and to the cap materials are used over the metal contact are implemented.

For split gates, it is beneficial for a self-alignment flow that the dielectric fill material used in the metal gate is not a material used for capping the metal contacts. In the self-aligned contact and gate process, the gate cap is opened selectively to the metal contact cap and gate low-k spacers and punched through. When the gate cap is punched, the etch can then be transitioned to that of the dielectric fill material so that the via-to-lower-gate can make contact to the lower gate without further erosion of the gate low-k spacer or the metal contact cap.

Figure 21:
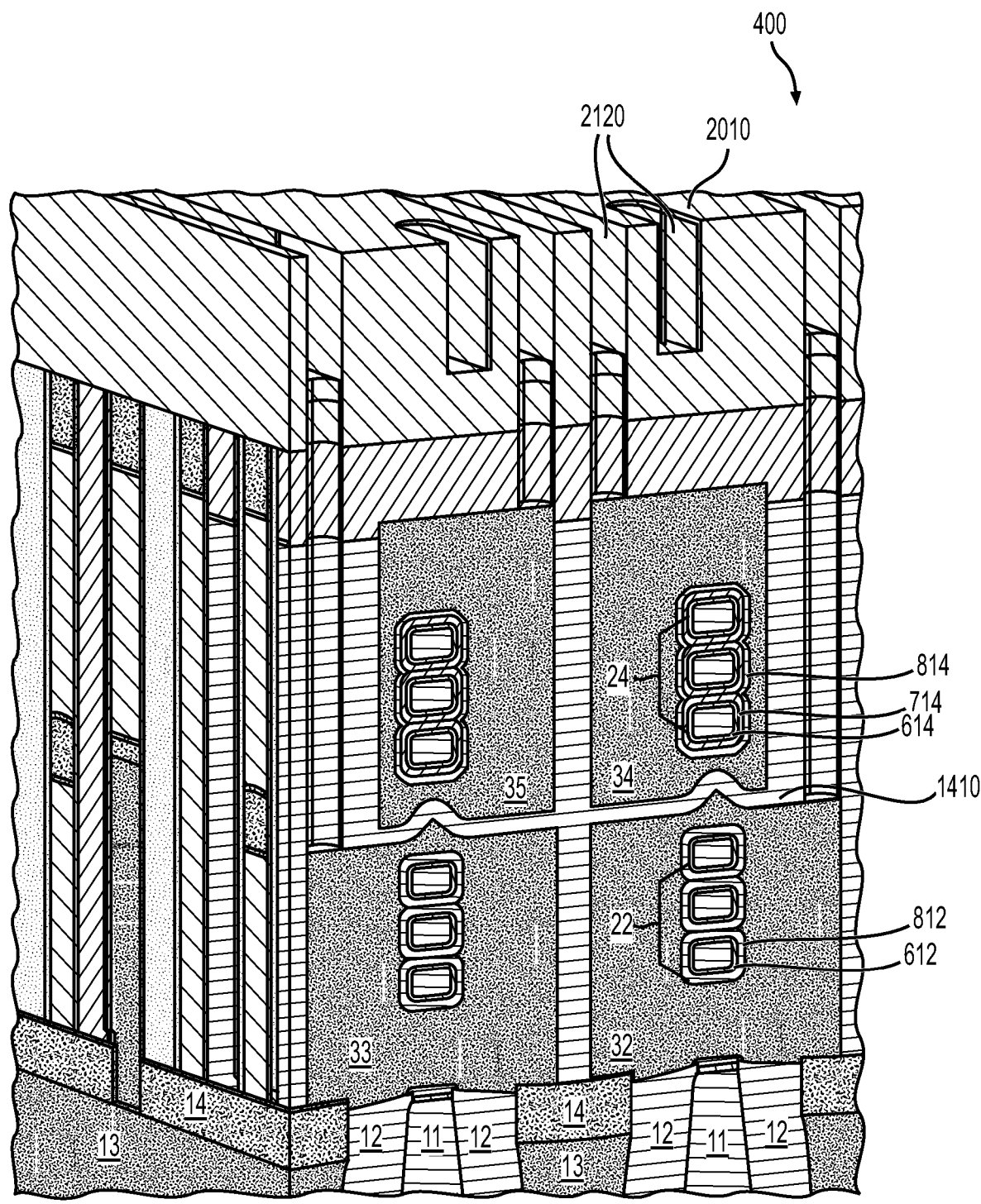

FIG. 21 shows an embodiment where patterns 2120 are formed in the patterning material 2010. Referring to FIG. 4, the routing tracks 2220(1)-(6) and the conducting traces 2230(2)-(5) can be formed by depositing one or more conductive materials, such as transition metals including Ru. FIGS. 4-21 show various intermediary steps of the manufacturing process in one sequence, however, the manufacturing process can be implemented using any suitable sequence of the various intermediary steps. For example, the common gates can be formed after forming the split gates in FIG. 18. On the other hand, in order to form the split gates, the conductive traces, and the routing tracks, the manufacturing process can be implemented using the series of selective depositions of gate materials, using the one or more conductive materials having anisotropic etching property in the third structures, using the anisotropic and selective etching process in forming trenches, using the selective deposition of dielectric materials over the conductive materials of the lower gates, and the like. Referring to FIG. 21, in the first example, M0 trench (e.g., 2120) definition making contact to via-to-lower-gate, via-to-upper-gate, via-to-lower source/drain electrode and via-to-upper source/drain electrode can be implemented.

Referring to FIG. 4, in the first example, the vias described above and M0 (e.g., 2220(1)-(6)) are filled. In an embodiment, connections to the split gates can come from the initial metal layer. In another embodiment, in some CFET designs, it can be beneficial to have source/drain contacts made to M0 (e.g., 2220(1)-(6)) and to have gate connections done through M1 (not shown).

Any suitable integration flows can be used in a manufacturing process to form the semiconductor apparatus 400 or other semiconductor devices. An integration flows can include a plurality of the intermediate steps described in the disclosure executed in any suitable order. In addition, one or more intermediary steps of the manufacturing process can be suitably modified for various situations. In an example, when the selective deposition of dielectric materials over the one or more conductive materials is not feasible, an alternative manufacturing process can be employed. Referring to FIG. 8, the lower gates can be covered by a non-conductive filling material, such as SOC recessed to the first recess level 715. Subsequently, a first dielectric layer can be selectively formed over the second structures of the upper gates. The non-conductive filling material can then be removed, for example, by an etching process that removes the non-conductive filling material selectively without removing the first dielectric layer. The first dielectric layer can provide selectivity in the subsequent manufacturing process. For example, a bottom-fill deposition of the one or more conductive materials, such as transition metals including Ru, can be implemented to form the third structures of the lower gates. The bottom-fill deposition is selective such that the deposition of the one or more conductive materials over the first dielectric layer is minimal. In addition, a selective deposition of the dielectric separation layer 1410 can be implemented, and thus, the deposition of the dielectric separation layer 1410 over the first dielectric layer is also minimal. As a result, the one or more conductive materials and the dielectric separation layer 1410 over the first dielectric layer can be removed by, for example, a CERTAS etching process, or atomic-layer etching.

In an example, the lower gate is filled with a non-conductive filling material prior to deposition of transition metal such as Ru in order to expose the upper TiN on the upper gate-all-around structure. A dielectric film is selectively deposited onto the TiN surface. The non-conductive filling material can be removed from the lower gate prior to filling in the gate with transition metal and recess. The dielectric film selectively deposited along the TiN surface is significantly less than the selective deposition to be done on the transition metal surface and is then removed through a vapor-phase selective etching along with a thin, controlled portion of the dielectric film selectively deposited along the surface of the transition metal.

Figure 22:
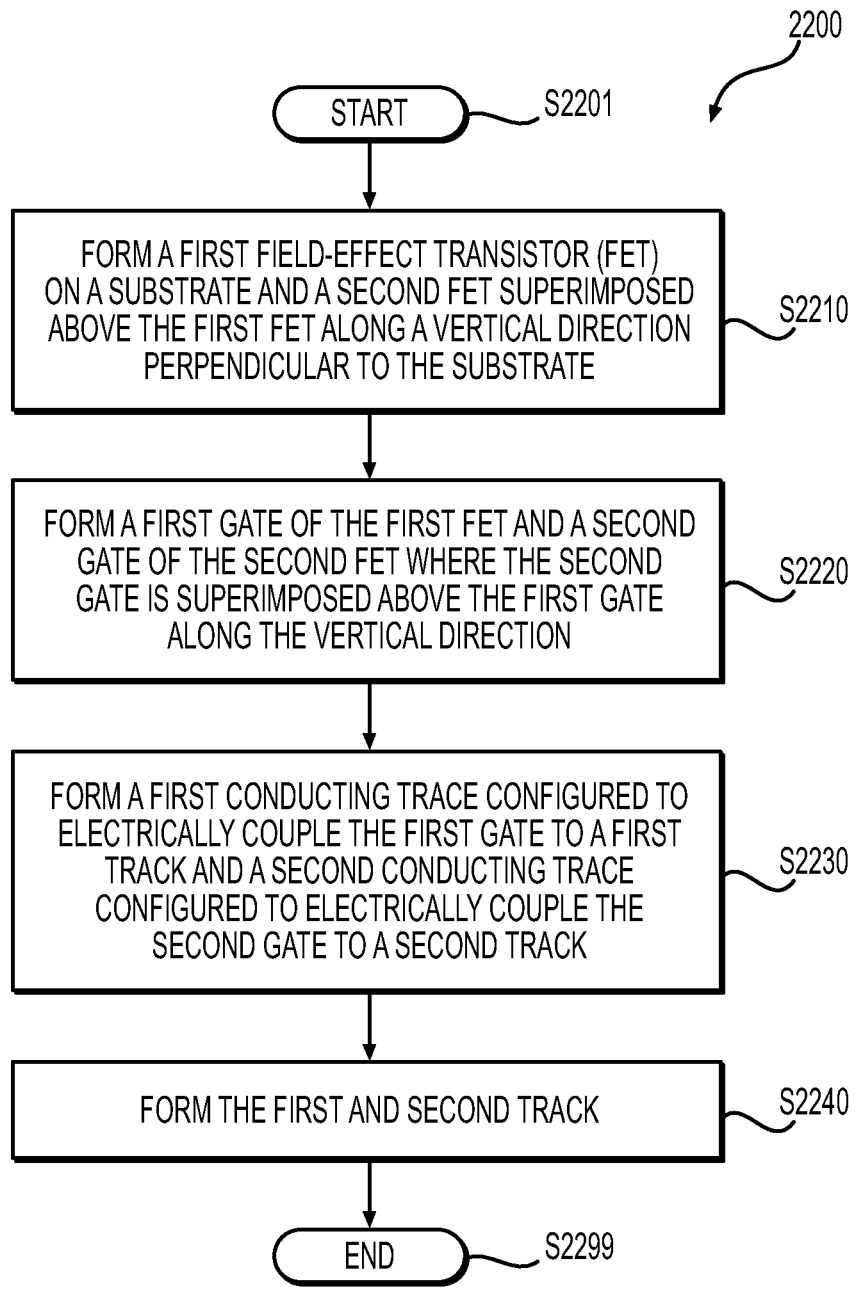
FIG. 22 shows an exemplary process flow to form a semiconductor device according to an embodiment of the disclosure.

FIG. 22 shows an exemplary process flow 2200 to form a semiconductor device according to an embodiment of the disclosure. The process flow 2200 can be configured to form a first stack of CFETs and a third stack of CFETs. The first stack of CFETs includes split gates, a first gate of the first FET, and a second gate of the second FET. The third stack of CFETs includes split gates, a fifth gate of the fifth FET, and a sixth gate of the sixth FET. Further, each gate is connected to either a first routing track or a second routing track via a separated conductive trace. Each routing track is connected to multiple gates where one gate is based on an nFET and another gate is based on a pFET. In an example, the first stack of CFETs and the third stack of CFETs formed by the process flow 2200 are the first stack of FETs 398 and the second stack of FETs 399 shown in FIGS. 3A-3C. In another example, the first stack of CFETs and the third stack of CFETs formed by the process flow 2200 are the first stack of FETs (FIG. 4) and the third stack of FETs of the semiconductor apparatus 400, respectively. The process flow 2200 is illustrated using the first stack of FETS and the third stack of FETs of the semiconductor apparatus 400, the disclosure can be suitably modified to apply to other scenarios. The process flow 2200 starts at S2201 and proceeds to S2210.

At S2210, the first stack of CFETs including the first FET and the second FET is formed, as shown in FIG. 5. The third stack of CFETs including the fifth FET and the sixth FET is formed. In an embodiment, the first FET and the fifth FET are formed on a first plane, and the second FET and the sixth FET are formed on a second plane above the first plane. Further, the second FET is stacked above the first FET, and the sixth FET is stacked above the fifth FET.

As described above, sources and drains of FETs in the first stack and the second stack are manufactured and metalized. The channels are exposed. As shown in FIG. 5, the channels are sandwiched between the gate low-k spacers 15 located on adjacent structures 18. The residual FIN dielectric liner 510 can facilitate formation of the first to the fourth channels 22-25.

At S2220, split gates are formed. For example, in the semiconductor apparatus 400, the first gate 32 of the first FET and the second gate 34 of the second FET form split gates in the region 19(1). The second gate 34, formed on the second plane, is stacked above the first gate 32 formed on the first plane. The fifth gate of the fifth FET and the sixth gate of the sixth FET form split gates in the region 19(2). The sixth gate, formed on the second plane, is stacked above the fifth gate formed on the first plane.

In an embodiment, the lower gates, such as the first gate 32 and the fifth gate, can include the first structures, the second structures, and the third structures. The upper gates, such as the second gate 34 and the sixth gate, can include the first structures, the WF structure, the second structures, and the third structures. In an embodiment, the first structures can be formed on the lower gates and the upper gates simultaneously using the first and second selective depositions as shown in FIG. 6. The WF structures can be formed on the upper gates as shown in FIG. 7 using the third selective deposition. Subsequently, the second structures can be formed simultaneously on the lower gates and the upper gates using the fourth selective deposition as shown in FIG. 8.

The lower gates can be fabricated by using one or more conductive materials having anisotropic etching property as the third structures and by implementing the anisotropic and selective etching process, as shown in FIGS. 11-13. Subsequently, the selective deposition of the dielectric separation layer 1410 can be implemented to physically and electrically separate the lower gates from the upper gates, as shown in FIG. 14. Similarly, the upper gates can be fabricated by using one or more conductive materials having anisotropic etching property as the third structures and by implementing the anisotropic and selective etching process, as shown in FIGS. 15-18. The process flow 2200 then proceeds to S2230.

At S2230, four separate conductive traces are formed for the four gates, and the first routing track 2220(2) and the second routing track 2220(4) are formed, as shown in FIGS. 19-21 and FIG. 4. The first conductive trace 2230(2) is formed to connect the first gate 32 to the first routing track 2220(2), the second conductive trace 2230(4) is formed to connect the second gate 34 to the second routing track 2220(4), the fifth conductive trace is formed to connect the fifth gate to the second routing track 2220(4), and the sixth conductive trace is formed to connect the sixth gate to the first routing track 2220(2).

When common gates are used, more steps can be implemented to fabricate the common gates, such as shown in FIGS. 9-10, when describing the fabrication of the semiconductor apparatus 400.

The process flow 2200 shows an embodiment of a process flow in one sequence of steps, however, the process flow can be implemented using any suitable sequence of steps. On the other hand, in order to form the split gates, the conductive traces, and the routing tracks, the process flow 2200 can be implemented using the series of selective depositions of gate materials, using the one or more conductive materials having anisotropic etching property in the third structures, using the anisotropic and selective etching process in forming trenches, using the selective deposition of dielectric materials over the conductive materials of the lower gates, and the like.

The process flow 2200 is described using a stack of FETs such as the first stack of FETs in the semiconductor apparatus 400 where the upper gate has a smaller cross sectional area than that of the lower gate. The process flow 2200 can be suitably adjusted to form a stack of FETs similar to the stack of FETs shown in FIGS. 2A-2B and 3A-3C where the upper gate can have the same or larger cross sectional area than that of the lower gate. In an example, the patterns 1230 in FIG. 12, the trenches 1330 in FIG. 13, the patterns 1620 in FIG. 16, and the trenches 1720 in FIG. 17 can be modified to form the stack of FETs shown in FIGS. 2A-2B and 3A-3C.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A semiconductor apparatus comprising:
a first field-effect transistor (FET) formed on a substrate and comprising a first gate and a first channel;
a second FET stacked on the first FET along a direction substantially perpendicular to the substrate and comprising a second gate and a second channel, the first channel and the second channel being separated and conductively isolated by a dielectric layer;
a first routing track and a second routing track electrically isolated from the first routing track, each of the first and second routing tracks being provided on a routing plane stacked on the second FET along the direction;
a first conductive trace configured to conductively couple the first gate of the first FET to the first routing track; and
a second conductive trace configured to conductively couple the second gate of the second FET to the second routing track.

2. The semiconductor apparatus of claim 1, wherein the second gate is stacked directly above the first gate along the direction substantially perpendicular to the substrate.

3. The semiconductor apparatus of claim 2, wherein the first and second routing tracks are provided above the second gate along the direction substantially perpendicular to the substrate.

4. The semiconductor apparatus of claim 1, wherein the first conductive trace bypasses the second gate and the second FET.

5. The semiconductor apparatus of claim 1, further comprising:
a third FET formed on the substrate and comprising a third gate;
a fourth FET stacked on the third FET along the direction substantially perpendicular to the substrate and comprising a fourth gate;
a third conductive trace configured to conductively couple the third gate of the third FET to the second routing track; and
a fourth conductive trace configured to conductively couple the fourth gate of the fourth FET to the first routing track.

6. The semiconductor apparatus of claim 5, wherein the fourth gate is stacked on the third gate along the direction.

7. The semiconductor apparatus of claim 5, wherein the third conductive trace bypasses the fourth gate and the fourth FET.

8. The semiconductor apparatus of claim 1, wherein at least one of the first and the second gates includes a conductive material having an anisotropic etching property.

9. The semiconductor apparatus of claim 1, wherein the first and the second FETs are complementary FETs including a n-type FET and a p-type FET.

10. The semiconductor apparatus of claim 5, wherein the second gate is stacked on the first gate and the fourth gate is stacked on the third gate, the first and second routing tracks are provided on one or more routing planes above the first, second, third, and fourth gates along the direction, the first and second conductive traces are spatially separated, the first conductive trace bypasses the second gate and the second FET, and the second conductive trace bypasses the first gate and the first FET, the third and fourth conductive trace are spatially separated, the third conductive trace bypasses the fourth gate and the fourth FET, and the fourth conductive trace bypasses the third gate and the third FET, the first and fourth gates are conductively coupled to the first routing track via the first and fourth conductive traces, respectively, and the second and third gates are conductively coupled to the second routing track via the second and third conductive traces, respectively.

11. The semiconductor apparatus of claim 10, wherein a second gate area that is a gate area being a maximum cross-sectional area of the gate intersecting with a plane substantially perpendicular to the direction substantially perpendicular to the substrate, is equal to or larger than a first gate area, and a fourth gate area is equal to or larger than a third gate area, the second gate is staggered above the first gate, and the fourth gate is staggered above the third gate.

12. The semiconductor apparatus of claim 10, wherein a second gate area is less than a first gate area, and a fourth gate area is less than a third gate area, the second gate is staggered above the first gate, and the fourth gate is staggered above the third gate.

13. The semiconductor apparatus of claim 1, wherein the first FET further comprises a first set of semiconductor bars stacked along the direction in which the first gate surrounds and is attached to the first set of semiconductor bars, and wherein the second FET further comprises a second set of semiconductor bars stacked along the direction in which the second gate surrounds and is attached to the second set of semiconductor bars.

14. The semiconductor apparatus of claim 13, wherein the second set of semiconductor bars is stacked on the first set of semiconductors bars along the direction.

15. The semiconductor apparatus of claim 1, wherein at least one of the first gate and the second gate includes a transition metal.

16. The semiconductor apparatus of claim 15, wherein the transition metal is Ruthenium.

17. The semiconductor apparatus of claim 1, wherein the first gate and the second gate are separated and conductively isolated by the dielectric layer including one or more dielectric materials.

18. The semiconductor apparatus of claim 3, wherein at least one of the first gate and the second gate includes a first structure covering at least one of the first set and the second set of semiconductor bars, a second structure covering the first structure, and a third structure covering the second structure.

19. The semiconductor apparatus of claim 18, wherein the first structure includes a layer having high dielectric constant (high-k layer) and a barrier layer that prevents diffusion between the high-k layer and the second structure, the second structure includes a work-function layer that adjusts a work-function of the respective gate and a blocking layer that prevents diffusion between the work-function layer and the third structure, and the third structure includes one or more conductive materials.

20. A semiconductor apparatus comprising:
   a first field-effect transistor (FET) formed on a substrate and comprising a first gate and a first channel;
   a second FET stacked on the first FET along a direction substantially perpendicular to the substrate and comprising a second gate and a second channel, the first channel and the second channel being separated and conductively isolated by a dielectric layer, and the first gate and the second gate being separated and conductively isolated by the dielectric layer;
   a first routing track and a second routing track electrically isolated from the first routing track, each of the first and second routing tracks being provided on a routing plane stacked on the second FET along the direction;
   a first conductive trace configured to conductively couple the first gate of the first FET to the first routing track, the first conductive trace bypassing the second gate and the second FET; and
   a second conductive trace configured to conductively couple the second gate of the second FET to the second routing track.

* * * * *

UNITED STATES PATENT AND TRADEMARK OFFICE
CERTIFICATE OF CORRECTION

PATENT NO. : 10,833,078 B2
APPLICATION NO. : 16/206513
DATED : November 10, 2020
INVENTOR(S) : Smith et al.

Page 1 of 1

It is certified that error appears in the above-identified patent and that said Letters Patent is hereby corrected as shown below:

In the Claims

In Column 28, Claim 18, Line 57, delete "3," and insert -- 13, --, therefor.

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*